United States Patent
Sung et al.

(10) Patent No.: US 10,847,676 B2
(45) Date of Patent: Nov. 24, 2020

(54) SEMICONDUCTOR DEVICE AND SEMICONDUCTOR DEVICE PACKAGE INCLUDING SAME

(71) Applicant: LG INNOTEK CO., LTD., Seoul (KR)

(72) Inventors: Youn Joon Sung, Seoul (KR); Ki Man Kang, Seoul (KR); Min Sung Kim, Seoul (KR); Su Ik Park, Seoul (KR); Yong Gyeong Lee, Seoul (KR); Eun Dk Lee, Seoul (KR); Hyun Soo Lim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 16/347,010

(22) PCT Filed: Nov. 3, 2017

(86) PCT No.: PCT/KR2017/012403
§ 371 (c)(1),
(2) Date: May 2, 2019

(87) PCT Pub. No.: WO2018/084631
PCT Pub. Date: May 11, 2018

(65) Prior Publication Data
US 2019/0259910 A1   Aug. 22, 2019

(30) Foreign Application Priority Data

Nov. 3, 2016  (KR) .................. 10-2016-0145902
Nov. 9, 2016  (KR) .................. 10-2016-0148887

(51) Int. Cl.
*H01L 33/10*  (2010.01)
*H01L 33/36*  (2010.01)
(Continued)

(52) U.S. Cl.
CPC .............. *H01L 33/10* (2013.01); *H01L 33/02* (2013.01); *H01L 33/22* (2013.01); *H01L 33/32* (2013.01);
(Continued)

(58) Field of Classification Search
CPC ..... H01L 33/405; H01L 33/10; H01L 33/382; H01L 33/36
See application file for complete search history.

(56) References Cited

U.S. PATENT DOCUMENTS

2012/0286309 A1   11/2012   Chae et al.
2012/0299038 A1   11/2012   Hwang et al.
(Continued)

FOREIGN PATENT DOCUMENTS

CN    104362239    2/2015
EP    2 728 631    5/2014
(Continued)

OTHER PUBLICATIONS

International Search Report (with English Translation) and Written Opinion dated Feb. 12, 2018 issued in Application No. PCT/KR2017/012403.
(Continued)

*Primary Examiner* — Dale E Page
*Assistant Examiner* — Wilner Jean Baptiste
(74) *Attorney, Agent, or Firm* — Ked & Associates LLP

(57) ABSTRACT

Disclosed in one embodiment is a semiconductor device comprising: a light-emitting structure including a first conductive semiconductor layer, a second conductive semiconductor layer, and an active layer arranged between the first conductive semiconductor layer and the second conductive semiconductor layer; a first electrode electrically connected with the first conductive semiconductor layer; a second electrode electrically connected with the second conductive
(Continued)

semiconductor layer; a reflective layer arranged on the second electrode; and a capping layer arranged on the reflective layer and including a plurality of layers, wherein the capping layer includes a first layer directly arranged on the reflective layer and the first layer includes Ti.

7 Claims, 12 Drawing Sheets

(51) Int. Cl.
    *H01L 33/62*      (2010.01)
    *H01L 33/32*      (2010.01)
    *H01L 33/02*      (2010.01)
    *H01L 33/48*      (2010.01)
    *H01L 33/42*      (2010.01)
    *H01L 33/22*      (2010.01)

(52) U.S. Cl.
    CPC .............. *H01L 33/36* (2013.01); *H01L 33/42* (2013.01); *H01L 33/48* (2013.01); *H01L 33/62* (2013.01)

(56) References Cited

U.S. PATENT DOCUMENTS

| | | |
|---|---|---|
| 2013/0146910 A1 | 6/2013 | Maute et al. |
| 2013/0153920 A1 | 6/2013 | Sugawara |
| 2017/0154921 A1* | 6/2017 | Kim ........................ H01L 33/38 |

FOREIGN PATENT DOCUMENTS

| | | |
|---|---|---|
| KR | 2012-0126824 | 11/2012 |
| KR | 2012-0126856 | 11/2012 |
| KR | 2012-0132212 | 12/2012 |
| KR | 2014-0057811 | 5/2014 |
| WO | WO 2016/129873 | 8/2016 |

OTHER PUBLICATIONS

European Search Report dated May 20, 2020 issued in Application No. 17868255.5.

European Search Report dated Jul. 10, 2020 issued in Application No. 17868255.5.

* cited by examiner

SEMICONDUCTOR DEVICE AND SEMICONDUCTOR DEVICE PACKAGE INCLUDING SAME

CROSS-REFERENCE TO RELATED PATENT APPLICATIONS

This application is a U.S. National Stage Application under 35 U.S.C. § 371 of PCT Application No. PCT/KR2017/012403, filed Nov. 3, 2017, which claims priority to Korean Patent Application Nos. 10-2016-0145902, filed Nov. 3, 2016 and 10-2016-0148887, filed Nov. 9, 2016, whose entire disclosures are hereby incorporated by reference.

TECHNICAL FIELD

The present invention relates to a semiconductor device and a semiconductor device package including the same.

BACKGROUND ART

A semiconductor device including a compound, such as GaN and AlGaN, has many advantages, such as wide and adjustable band-gap energy, and thus may be diversely used for light-emitting devices, light-receiving devices, various diodes, and the like.

In particular, a light-emitting device, such as a light-emitting diode or a laser diode, formed of a III-V group or II-VI group compound semiconductor material can realize various colors, such as red, green, and blue, or emit ultraviolet light, due to the development of thin-film growth technology and device materials. The light-emitting device can also emit efficient white light by using a fluorescent material or combining colors and has the advantages of low power consumption, semi-permanent lifetime, high response speed, safety, and environmental friendliness as compared to existing light sources such as fluorescent lamps and incandescent lamps.

Moreover, due to the development of device materials, when a light-receiving device, such as a photodetector or a solar cell, is fabricated with a III-V group or II-VI group compound semiconductor material, the light-receiving device generates a photocurrent by absorbing light in various wavelength regions. Therefore, it is possible to use light in various wavelength regions from the gamma-ray region to the radio-wave region. Also, due to the advantages of high response speed, safety, environmental friendliness, and ease of adjusting a device material, the light-receiving device can be readily used in power control or a ultra-high frequency circuit or communication module.

Therefore, the applications of semiconductor devices are being expanded to transmission modules of optical communication means, light-emitting diode backlights which replace cold cathode fluorescence lamps (CCFLs) constituting the backlights of liquid crystal display (LCD) devices, white light-emitting diode illumination devices which may replace fluorescent lamps or incandescent lamps, vehicle headlights, traffic lights, sensors for sensing gas or fire, and the like. Also, the applications of semiconductor devices may be expanded to high-frequency application circuits, power control devices, and communication modules.

In particular, light-emitting devices which emit light in the ultraviolet wavelength region have a curing or sterilization effect and thus can be used for curing, medical treatment, and sterilization.

Active research is currently underway on ultraviolet light-emitting devices. However, vertical-type ultraviolet light-emitting devices are difficult to fabricate, and light extraction efficiency is relatively low.

DISCLOSURE

Technical Problem

The present invention is directed to providing a semiconductor device having improved light extraction efficiency.

The present invention is also directed to providing a semiconductor device having excellent current injection efficiency.

The present invention is also directed to providing a semiconductor device in which characteristics of a first electrode are improved by suppressing a ball-up phenomenon.

Objectives of the present invention are not limited thereto, and the present invention may encompass objectives and effects that can be derived from the technical solutions or embodiments described below.

Technical Solution

One aspect of the present invention provides a semiconductor device including: a light-emitting structure including a first conductive semiconductor layer, a second conductive semiconductor layer, and an active layer disposed between the first conductive semiconductor layer and the second conductive semiconductor layer; first electrodes electrically coupled to the first conductive semiconductor layer; a second electrode electrically coupled to the second conductive semiconductor layer; a reflective layer disposed on the second electrode; and a capping layer disposed on the reflective layer and including a plurality of layers. The capping layer includes a first layer disposed on the reflective layer, and the first layer includes Ti.

The capping layer may further include an intermediate layer disposed on the first layer and including a plurality of layers, the intermediate layer may include a first intermediate layer disposed directly on the first layer and including Ni, and a thickness ratio of the first layer to the first intermediate layer may be in a range of 1:1 to 3:1.

The capping layer may further include a second layer disposed on the first layer, and the second layer may include Au.

The first layer may be disposed on one side of the capping layer, and the second layer may be disposed on the other side of the capping layer.

The intermediate layer may include at least one first intermediate layer including Ni.

One of the at least one first intermediate layer may be disposed on the first layer.

A thickness ratio of the first layer to the first intermediate layer may be in the range of 1:1 to 3:1.

The intermediate layer may further include at least one second layer including Ti.

A bonding layer may be additionally disposed between the second electrode and the reflective layer.

The light-emitting structure may further include a plurality of recesses passing through the second conductive semiconductor layer and the active layer and extending to a partial region of the first conductive semiconductor layer, and the first electrodes may be disposed in the plurality of recesses.

Another aspect of the present invention provides a semiconductor device including: a light-emitting structure including a first conductive semiconductor layer, a second conductive semiconductor layer, and an active layer disposed between the first conductive semiconductor layer and the second conductive semiconductor layer; first electrodes electrically coupled to the first conductive semiconductor layer; and a second electrode electrically coupled to the second conductive semiconductor layer. The first electrodes include a first layer, a second layer, and a third layer, the first layer includes a first metal layer including a first metal, a diffusion coefficient of the first metal is greater than a diffusion coefficient of a third metal included in the third layer, and a thickness of the second layer is in a range of 0.4 to 0.53 times a thickness of the first metal layer.

The second layer may be disposed between the first metal layer and the third layer.

The first layer may further include a $1^{st}$-1 layer and a $1^{st}$-2 layer disposed between the $1^{st}$-1 layer and the first metal layer, and the thickness of the first metal layer may be in a range of 1.5 to 2.5 times the sum of thicknesses of the $1^{st}$-1 layer and the $1^{st}$-2 layer.

The $1^{st}$-1 layer may include Cr, and the $1^{st}$-2 layer may include Ti.

The semiconductor device may further include a reflective layer disposed on the second electrode and a capping layer disposed on the reflective layer and including a plurality of layers.

The light-emitting structure may further include a plurality of recesses passing through the second conductive semiconductor layer and the active layer and extending to a partial region of the first conductive semiconductor layer, and the first electrodes may be disposed in the plurality of recesses.

Another aspect of the present invention provides a semiconductor device including: a light-emitting structure including a first conductive semiconductor layer, a second conductive semiconductor layer, and an active layer disposed between the first conductive semiconductor layer and the second conductive semiconductor layer; first electrodes electrically coupled to the first conductive semiconductor layer and including a plurality of layers; and a second electrode electrically coupled to the second conductive semiconductor layer. The first electrodes include a first layer, a second layer, and a third layer, the first layer includes a first region and a second region, a diffusion coefficient of a first metal included in the first layer is greater than a diffusion coefficient of a third metal included in the third layer, a ratio of the first metal included in the second region is greater than a ratio of the first metal included in the first region, and a thickness ratio of the first region to the second region is in a range of 3:7 to 6.3:3.5.

The second layer may be disposed between the second region and the third layer.

The first metal may be Al, and a ratio of an Al ratio of the first region to an Al ratio of the second region may be in the range of 1:1.5 to 1:2.5.

Another aspect of the present invention provides a semiconductor device package including: a body and a semiconductor device. The semiconductor device includes: a light-emitting structure including a first conductive semiconductor layer, a second conductive semiconductor layer, and an active layer disposed between the first conductive semiconductor layer and the second conductive semiconductor layer; first electrodes electrically coupled to the first conductive semiconductor layer; a second electrode electrically coupled to the second conductive semiconductor layer; a reflective layer disposed on the second electrode; and a capping layer disposed on the reflective layer and including a plurality of layers. The capping layer includes a first layer disposed on the reflective layer, and the first layer includes Ti.

Advantageous Effects

According to embodiments of the present invention, light extraction efficiency can be improved by minimizing dark spots in a reflective layer of a semiconductor device.

Also, it is possible to mitigate stress and also improve current injection efficiency by stacking capping layers of a semiconductor device in a plurality of layers.

Further, it is possible to improve characteristics of a first electrode (an ohmic electrode) of a semiconductor device by suppressing a ball-up phenomenon of the first electrode.

Various useful advantages and effects of the present invention are not limited to those mentioned above and will be easily understood from the detailed description of the embodiments of the present invention.

MODES OF THE INVENTION

Embodiments of the present invention may be modified into other forms, and several embodiments may be combined with each other. The scope of the present invention is not limited to each of the embodiments described below.

Even when a description of a specific embodiment is not repeated in another embodiment, the description may be understood as pertaining to the other embodiment unless the contrary or something contradictory is stated in another embodiment.

For example, assuming that characteristics of a configuration A are described in a specific embodiment and characteristics of a configuration B are described in another embodiment, even when an embodiment in which the configuration A and the configuration B are combined is not clearly stated, it should be understood that the embodiment belongs to the scope of the present invention unless the contrary or something contradictory is stated.

In describing the embodiments, when any one element is stated to be formed "on or under" another element, the two elements may be formed in direct contact with each other or formed in indirect contact with each other, that is, one or more other elements may be formed between the two elements. Also, the term "on or under" may indicate not only an upper direction of one element but also a lower direction of the element.

A semiconductor device may include various types of electronic devices, such as a light-emitting device and a light-receiving device. Each of the light-emitting device and the light-receiving device may include a first conductive semiconductor layer, an active layer, and a second conductive semiconductor layer.

A semiconductor device according to embodiments of the present invention may be a light-emitting device.

A light-emitting device emits light when electrons combine with holes, and the wavelength of the light is determined by a unique energy band gap of a material. Therefore, the emitted light may vary according to the composition of the material.

Hereinafter, embodiments of the present invention will be described in detail with reference to the accompanying drawings so that those of ordinary skill in the art to which the present invention pertains may readily implement the embodiments.

Figure 1:
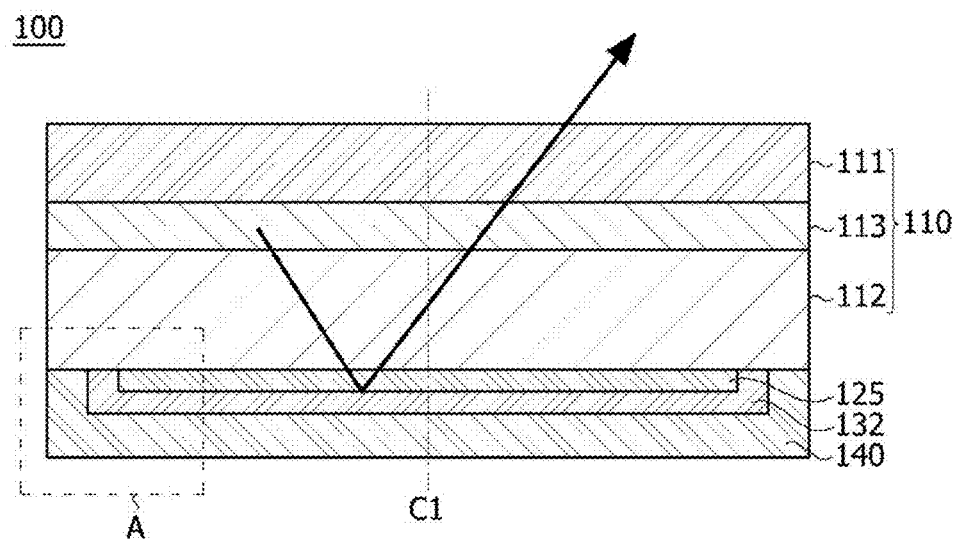
FIG. 1 is a conceptual view of a semiconductor device according to a first embodiment of the present invention.
Figure 2A:
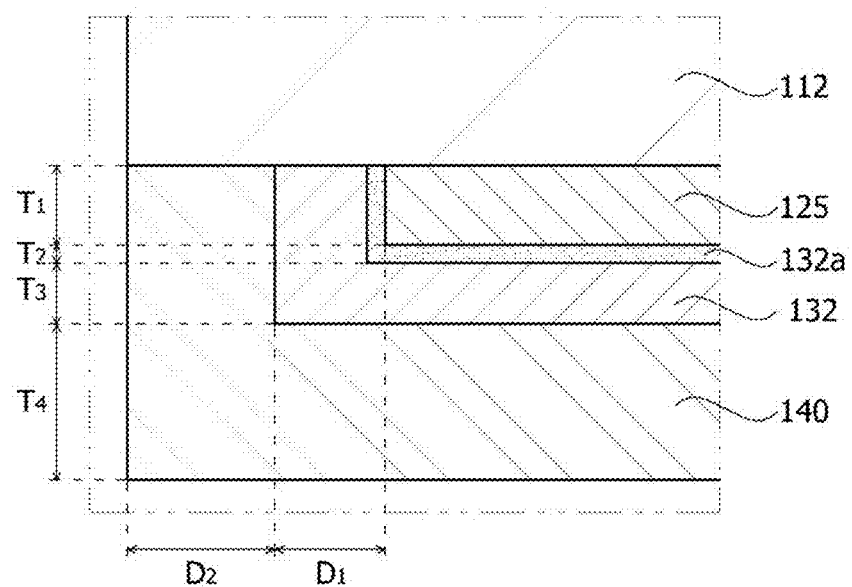
FIG. 2A is an enlarged view of a portion A of FIG. 1.
Figure 2B:
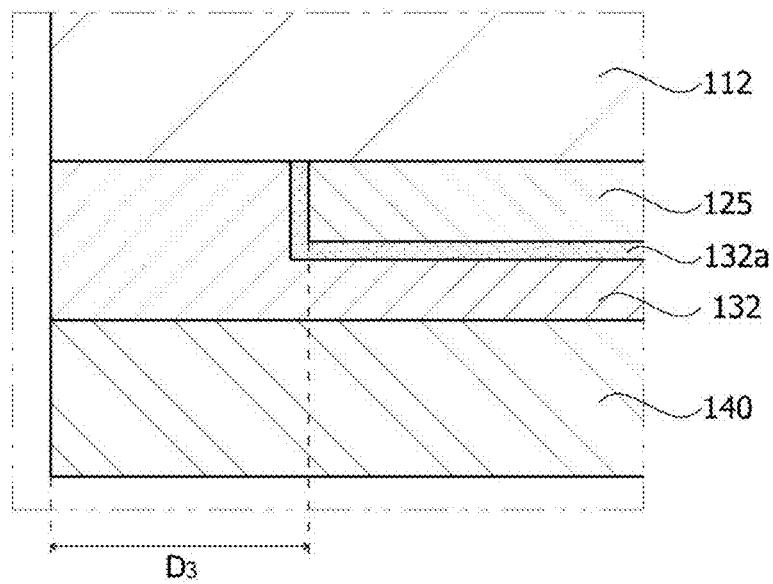
FIG. 2B shows a modified example of FIG. 2A.

FIG. 1 is a conceptual view of a semiconductor device according to a first embodiment of the present invention. FIG. 2A is an enlarged view of a portion A of FIG. 1. FIG. 2B shows a modified example of FIG. 2A. FIGS. 3A to 3D show various modified examples of a capping layer in the semiconductor device according to the first embodiment of the present invention.

The semiconductor device according to the embodiment of the present invention may output light in an ultraviolet wavelength range. For example, the semiconductor device may output light in a near ultraviolet (UV-A) wavelength range, light in a far ultraviolet (UV-B) wavelength range, and light in a deep ultraviolet (UV-C) wavelength range. A wavelength range may be determined by a composition ratio of Al in the semiconductor device.

For example, light in a near ultraviolet (UV-A) wavelength range may have a wavelength ranging from 320 nm to 420 nm, light in a far ultraviolet (UV-B) wavelength range may have a wavelength ranging from 280 nm to 320 nm, and light in a deep ultraviolet (UV-C) wavelength range may have a wavelength ranging from 100 nm to 280 nm.

Referring to FIGS. 1 and 2A, a semiconductor device 100 according to the first embodiment of the present invention may include a light-emitting structure 110, a second electrode 125, a reflective layer 132, and a capping layer 140.

The light-emitting structure 110 may include a first conductive semiconductor layer 111, a second conductive semiconductor layer 112, and an active layer 113 disposed between the first conductive semiconductor layer 111 and the second conductive semiconductor layer 112.

The first conductive semiconductor layer 111 may be implemented as a semiconductor composed of a chemical compound containing a —V group or —VI group and may be doped with a first dopant. The first conductive semiconductor layer 111 may be selected from semiconductor materials having the empirical formula "$In_{x1}Al_{y1}Ga_{1-x1-y1}N$ ($0 \leq x1 \leq 1, 0 \leq y1 \leq 1, 0 \leq x1+y1 \leq 1$)," for example, GaN, AlGaN, InGaN, and InAlGaN. The first dopant may be an n-type dopant such as Si, Ge, Sn, and Te. When the first dopant is an n-type dopant, the first conductive semiconductor layer 111 doped with the first dopant may be an n-type semiconductor layer.

The second conductive semiconductor layer 112 may be implemented as a semiconductor composed of a chemical compound containing a —V group or —VI group and may be doped with a second dopant. The second conductive semiconductor layer 112 may be formed of a semiconductor material having the empirical formula "$In_{x5}Al_{y2}Ga_{1-x5-y2}N$ ($0 \leq x5 \leq 1, 0 \leq y2 \leq 1, 0 \leq x5+y2 \leq 1$)" or a material selected from among AlInN, AlGaAs, GaP, GaAs, GaAsP, and AlGaInP. When the second dopant is a p-type dopant such as Mg, Zn, Ca, Sr, and Ba, the second conductive semiconductor layer 112 doped with the second dopant may be a p-type semiconductor layer.

The active layer 113 may be disposed between the first conductive semiconductor layer 111 and the second conductive semiconductor layer 112. In the active layer 113, electrons (or holes) injected through the first conductive semiconductor layer 111 meet holes (or electrons) injected through the second conductive semiconductor layer 112. When electrons and holes recombine, the active layer 113 may be transitioned to a low energy level and generate light having the ultraviolet wavelength.

The active layer 113 may have any one of a single well structure, a multi-well structure, a single quantum well structure, a multi-quantum well structure, a quantum dot structure, and a quantum wire structure, but the structure of the active layer 113 is not limited thereto.

The second electrode 125 may be disposed on the second conductive semiconductor layer 112. The second electrode 125 may be in ohmic contact with the second conductive semiconductor layer 112. In a cross-sectional view of the semiconductor device 100, ends of the second electrode 125 may be located further inside than ends of the second conductive semiconductor layer 112.

The second electrode 125 may include a transparent conductive oxide (TCO) which relatively absorbs less ultraviolet light. The TCO may be selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, and the like.

According to the embodiment, the second electrode 125 may be in direct contact with a semiconductor layer which has a larger band gap (e.g., p-AlGaN) than the energy of ultraviolet light. Conventionally, the second electrode 125 is disposed on a semiconductor layer having a small band gap (e.g., a GaN layer) for ohmic contact, which involves the problem in that most ultraviolet light is absorbed in the GaN layer. However, the second electrode 125 of the embodiment is in direct ohmic contact with a semiconductor layer having a large band gap (e.g., p-AlGaN), and accordingly, most light may pass through the second conductive semiconductor layer 112.

For example, a surface layer of the second conductive semiconductor layer 112 in contact with the second electrode 125 may have an Al composition of 1% to 10%. When the Al composition of the surface layer is less than 1%, light is excessively absorbed, and when the Al composition is greater than 10%, ohmic characteristics may be degraded.

Meanwhile, the second electrode 125 may generally absorb ultraviolet light. Therefore, it is necessary to improve light extraction efficiency while maintaining the ohmic contact of the second electrode 125. In other words, in the present invention, a TCO may be used as the second electrode to improve the light extraction efficiency while maintaining ohmic characteristics. In the present invention, transparency can be increased because the second electrode is a TCO, and it is possible to improve the light extraction efficiency due to a conductive layer (a reflective layer) having a reflective characteristic and disposed under the second electrode 125.

The second electrode 125 may have a thickness T1 of 1 nm to 10 nm. When the thickness of the second electrode 125 is less than 1 nm, cracks may be easily generated by external impact, and resistance increases such that current injection efficiency may be degraded. Also, when the thickness of the second electrode 125 is greater than 10 nm, transmittance is reduced such that light loss may occur.

The reflective layer 132 may be disposed on the second electrode 125. The reflective layer 132 may be disposed to cover the second electrode 125. For example, the reflective layer 132 may be disposed to surround the second electrode 125 except for an interface between the second conductive semiconductor layer 112 and the second electrode 125. The reflective layer 132 may be electrically coupled to the second electrode 125. Therefore, a current may be applied to the second conductive semiconductor layer 112 through the reflective layer 132.

The reflective layer 132 may be formed of a material with high reflectance. The reflective layer 132 may reflect light emitted from the active layer 113. A bonding layer 132a may be additionally disposed between the second electrode 125 and the reflective layer 132. The bonding layer 132a may increase bonding strength between the second electrode 125 and the reflective layer 132. The bonding layer 132a may be disposed to surround the second electrode 125. Alternatively, the bonding layer 132a may be disposed to cover not only the second electrode 125 but also at least a portion of the second conductive semiconductor layer 112.

The bonding layer 132a may be formed of one material selected from among Cr, ITO, and Ti, or a combination thereof in a single layer or multiple layers. When the bonding layer 132a includes ITO, the ITO may further include various materials which may increase the bonding strength. For example, the ITO may further include at least one material selected from among N, Zn, and Ga. When the ITO is deposited, such materials may also be deposited and disposed on an entire ITO region or disposed on only a surface of the ITO through surface processing. However, the materials of the bonding layer 132a are not limited thereto.

The bonding layer 132a may have a thickness T2 of 1 nm to 5 nm. The thickness of the bonding layer 132a may indicate a maximum height from an interface between the bonding layer 132a and the second electrode 125. When the thickness of the bonding layer 132a is less than 1 nm, the bonding strength between the second electrode 125 and the reflective layer 132 may be reduced. When the thickness of the bonding layer 132a is greater than 5 nm, transmittance is reduced such that light loss may occur.

The reflective layer 132 may have a thickness T3 of 50 nm to 2000 nm. The thickness of the reflective layer 132 may indicate a maximum height from an interface between the reflective layer 132 and the bonding layer 132a. When the thickness of the reflective layer 132 is less than 50 nm, the reflectance may be reduced. When the thickness of the reflective layer 132 is greater than 2000 nm, the reflection efficiency may be barely improved.

The capping layer 140 may be disposed on the reflective layer 132. The capping layer 140 may be disposed to cover the reflective layer 132. The capping layer 140 may be electrically coupled to the reflective layer 132. The capping layer 140 may improve physical reliability by protecting the reflective layer 132. Also, the capping layer 140 may supply a current to the second conductive semiconductor layer 112. The capping layer 140 may also function as a current-spreading layer.

The capping layer 140 may be formed of one material selected from among Ti, Ni, and Au, or a combination thereof in a single layer or multiple layers. However, the present invention is not limited thereto. In particular, the capping layer 140 may have a region which is in contact with the reflective layer 132. Ti may be disposed in the region of the capping layer in contact with the reflective layer 132. A structure of the capping layer 140 will be described in detail below.

Referring to FIG. 2A, an end of the second electrode 125 may be spaced a separation distance D1 from an end of the reflective layer 132. Specifically, a distance from a center C1 (see FIG. 1) of the second electrode 125 to the end of the reflective layer 132 may be greater than a distance from the center C1 of the second electrode 125 to the end of the reflective layer 132. Since the reflective layer 132 extends to cover a side surface of the second electrode 125, light emitted toward the side surface of the second electrode 125 may be reflected upward. In this way, the semiconductor device 100 according to the embodiment may improve light extraction efficiency.

The separation distance D1 between the end of the second electrode 125 and the end of the reflective layer 132 may be in the range of 2.5 μm to 5 μm. When the separation distance D1 is less than 2.5 μm, the reflectance may be reduced. When the separation distance D1 is greater than 5 μm, stress on the corner of the reflective layer 132 may be increased, and the reflection efficiency may be barely improved.

The end of the reflective layer 132 may be spaced a separation distance D2 from an end of the capping layer 140. Specifically, a distance from the center C1 (see FIG. 1) of the reflective layer 132 to the end of the capping layer 140 may be greater than a distance from the center C1 of the reflective layer 132 to the end of the reflective layer 132. Since the capping layer 140 extends to cover a side surface of the reflective layer 132, it is possible to protect the reflective layer 132.

The separation distance D2 between the end of the reflective layer 132 and the end of the capping layer 140 may be in the range of 2.5 μm to 5 μm. When the separation distance D2 is less than 2.5 μm, the current injection efficiency and the reflective layer protection effect may be degraded. When the separation distance D2 is greater than 5 μm, stress on the corner of the capping layer 140 may be increased.

FIG. 2B is a modified example of FIG. 2A.

Referring to FIG. 2B, the end of the second electrode 125 may be spaced a separation distance D3 from the end of the reflective layer 132. The separation distance D3 may be in the range of 2.5 μm to 5 μm. Also, the end of the second electrode 125 may be spaced the separation distance D3 from the end of the capping layer 140.

In other words, in FIG. 2B, the ends of the reflective layer 132 and the capping layer 140 may be collinear. This is because side surfaces of the reflective layer 132 have little influence on reflection efficiency and it may be meaningless to cover the side surfaces with the capping layer 140.

In other words, in the embodiment of the present invention, the reflective layer 132 is disposed to completely cover the second electrode 125 and may thereby contribute to an increase in reflectance. Also, the capping layer 140 is disposed to cover the upper surface of the reflective layer 132 or the entire reflective layer 132 such that a protection effect for the reflective layer 132 may be improved.

Referring to FIGS. 3A to 3D, various structures 140-1, 140-2, 140-3, and 140-4 of the capping layer 140 will be described below.

Figure 3A:
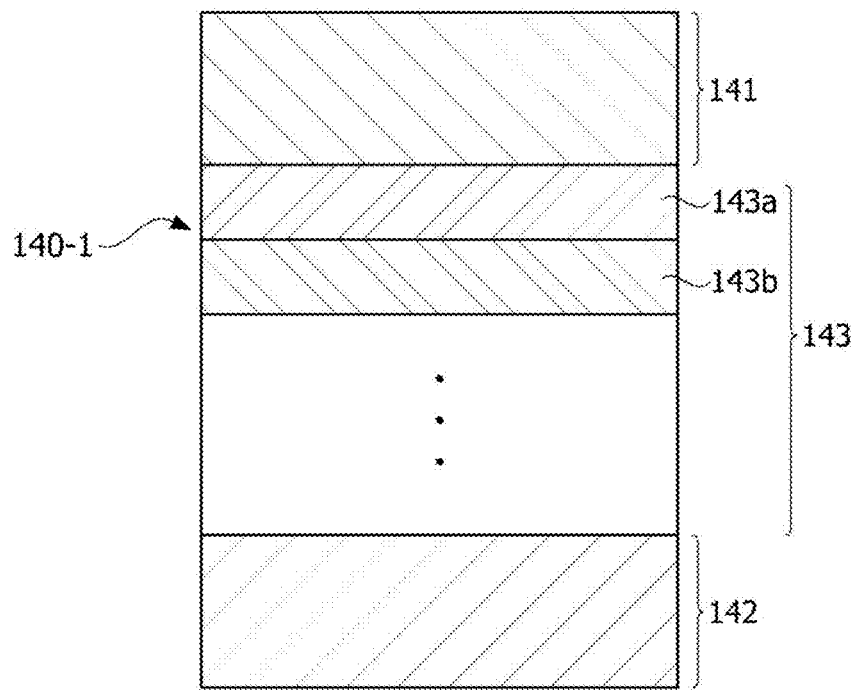
FIGS. 3A to 3D show various modified examples of a capping layer in the semiconductor device according to the first embodiment of the present invention.

First, referring to FIG. 3A, the capping layer 140-1 according to the first embodiment of the present invention may include a first layer 141, a second layer 142, and an intermediate layer 143.

The first layer 141 may be disposed on the reflective layer 132 For example, the first layer 141 may be in contact with the reflective layer 132. The first layer 141 may include Ti. When Ti is included in the first layer 141, it is possible to prevent metal materials in the intermediate layer 143 from being diffused into the reflective layer 132.

The second layer 142 may be disposed on the outermost side of the capping layer 140-1. Specifically, in the capping layer 140-1, the second layer 142 may be spaced farthest from the reflective layer 132. The second layer 142 may include Au. As the second layer 142 includes Au, it is possible to prevent oxidation or deformation of materials in the capping layer 140-1 during several processes to be carried out after the capping layer 140-1 is formed.

The second layer 142 may have a thickness of 30 nm to 300 nm. When the thickness of the second layer 142 is less than 30 nm, a deformation prevention effect for the capping layer 140-1 may be degraded. When the thickness of the second layer 142 is greater than 300 nm, thin film stress may increase.

The intermediate layer 143 may be disposed between the first layer 141 and the second layer 142. The intermediate layer 143 may be composed of a single layer or multiple layers. The intermediate layer 143 may be composed of one to six layers (the intermediate layer 143 may be omitted, but this is a configuration of FIG. 3B and will be described below). When the intermediate layer 143 includes more than six layers, process time and process complexity may increase such that process efficiency may be degraded.

The intermediate layer 143 may include at least one first intermediate layer 143a including Ni. The first intermediate layer 143a may be disposed on the first layer 141. For example the first intermediate layer 143a may be in contact with the first layer 141. Also, the intermediate layer 143 may further include at least one second intermediate layer 143b including Ti. It is self-evident that the second intermediate layer 143b may be omitted. When the intermediate layer 143 includes multiple first intermediate layers 143a and second intermediate layers 143b, the first intermediate layers 143a and the second intermediate layers 143b may be alternately disposed.

As described above, in the embodiment of FIG. 3A, the capping layer 140-1 may be composed of three to eight layers (the capping layer 140-1 may be composed of one or two layers, but this corresponds to configurations of FIGS. 3B and 3D and will be described below). The intermediate layer 143 may be composed of one to six layers. The intermediate layer 143 may include one to three first intermediate layers 143a. Also, the intermediate layer 143 may not exist or may include one to three second intermediate layers 143b.

When the number of layers constituting the intermediate layer 143 increases, the current injection efficiency of the capping layer 140-1 may be improved. In other words, since the capping layer 140-1 supplies a current to the second conductive semiconductor layer 112, an increase in the thickness of the capping layer 140-1 may result in an improvement in the current injection efficiency.

In the capping layer 140-1, layers including Ti (the first layers 141 or the second intermediate layers 143b) and layers including Ni (the first intermediate layers 143a) may be alternately disposed. When multiple different layers are alternately stacked in this way, stress may be reduced as compared to the case of forming one thick layer. Therefore, even when the overall thickness of the capping layer 140-1 is increased, it is possible to mitigate thin film stress and also improve the current injection efficiency.

Figure 3B:
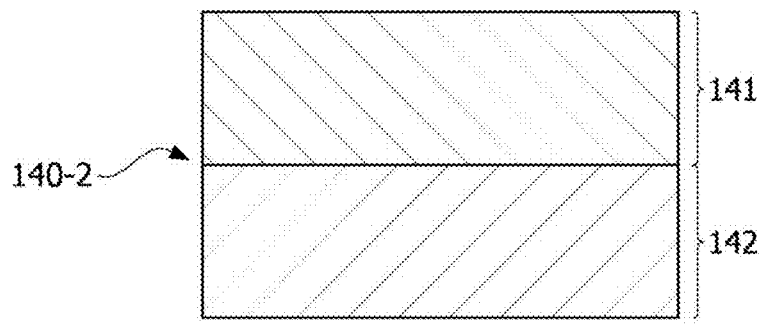

Referring to FIG. 3B, a capping layer 140-2 according to a second embodiment of the present invention may include a first layer 141 and a second layer 142. The first layer 141 and the second layer 142 may be configured in the same way as described above. In other words, the capping layer 140-2 shown in FIG. 3B may be obtained by omitting the intermediate layer 143 from the capping layer 140-1 shown in FIG. 3A.

Figure 3C:
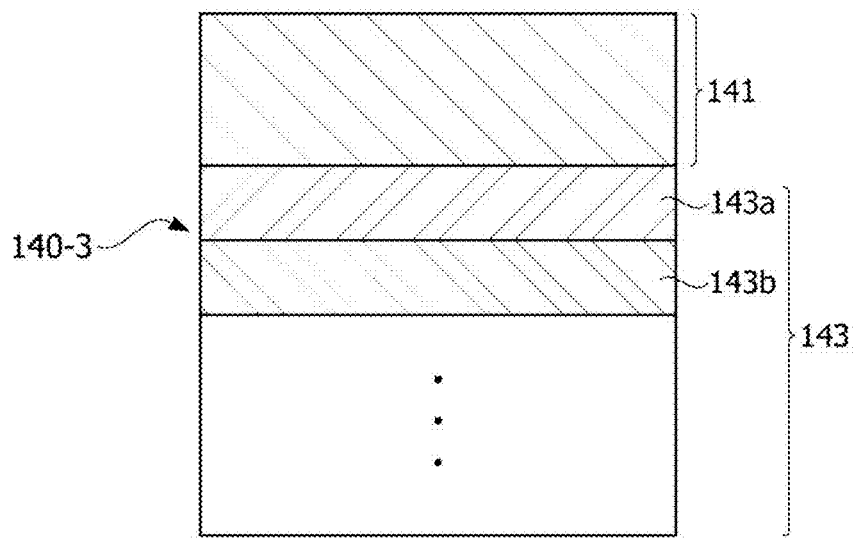

Referring to FIG. 3C, a capping layer 140-3 according to a third embodiment of the present invention may include a first layer 141 and an intermediate layer 143. The first layer 141 and the intermediate layer 143 may be configured in the same way as described above. In other words, the capping layer 140-3 shown in FIG. 3C may be obtained by omitting the second layer 142 from the capping layer 140-1 shown in FIG. 3A.

Figure 3D:
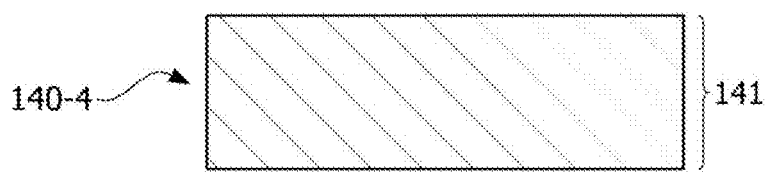

Referring to FIG. 3D, a capping layer 140-4 according to a fourth embodiment of the present invention may include a first layer 141. The first layer 141 may be configured in the same way as described above. In other words, the capping layer 140-4 shown in FIG. 3D may be obtained by omitting the second layer 142 and the intermediate layer 143 from the capping layer 140-1 shown in FIG. 3A.

As shown in FIGS. 3A to 3D, the capping layer 140 may be composed of at least one layer. The capping layer 140 may be composed of one to eighth layers. In this case, the intermediate layer 143 in the capping layer 140 may be composed of one to six layers. When the capping layer 140 includes more than eight layers, process time and process complexity may increase such that process efficiency may be degraded.

Specifically, the capping layer 140 may be formed of any one selected from among Ti, Ti/Au, Ti/Ni, Ti/Ni/Au, Ti/Ni/Ti, Ti/Ni/Ti/Au, Ti/Ni/Ti/Ni, Ti/Ni/Ti/Ni/Au, Ti/Ni/Ti/Ni/Ti, Ti/Ni/Ti/Ni/Ti/Au, Ti/Ni/Ti/Ni/Ti/Ni, Ti/Ni/Ti/Ni/Ti/Ni/Au, Ti/Ni/Ti/Ni/Ti/Ni/Ti, and Ti/Ni/Ti/Ni/Ti/Ni/Ti/Au.

The capping layer 140 has an overall thickness of 100 nm to 2000 nm. In this case, the overall thickness of the capping layer 140 may be at least 100 nm regardless of the number of layers included in the capping layer 140. For example, even when the capping layer 140 is composed of only a small number of layers such as one or two layers, the thickness of the capping layer 140 may be at least 100 nm. When the thickness of the capping layer 140 is less than 100 nm, the current injection efficiency and the protection effect for the reflective layer 132 may be degraded. When the thickness of the capping layer 140 is greater than 2000 nm, process time and process complexity may increase such that process efficiency may be degraded. Also, when the thickness of the capping layer 140 is greater than 2000 nm, thin film stress may be increased.

The first layer 141 in the capping layer 140 may have a thickness of 30 nm to 300 nm. When the thickness of the first layer 141 is less than 30 nm, a material included in the intermediate layer 143 (e.g., Ni) may be diffused into the reflective layer 132 In this case, dark spots (e.g., regions to which Ni has been diffused) may be generated, and reflectance may be reduced. When the thickness of the first layer 141 is greater than 300 nm, stress of the first layer 141 may be increased.

The first intermediate layer 143a and the second intermediate layer 143b may have a thickness of 10 nm to 300 nm. When the thickness of the first intermediate layer 143a is less than 10 nm, a stress mitigation effect may be barely achieved by alternately stacking different layers. When the thickness of the first intermediate layer 143a is greater than 300 nm, thin film stress may be increased.

A thickness ratio of the first layer 141 to the first intermediate layer 143a may be in the range of 1:1 to 3:1. When the thickness ratio of the first layer 141 to the first intermediate layer 143a is less than 1:1, a material included in the intermediate layer 143 may be diffused into the reflective layer 132 When the thickness ratio of the first layer 141 to the first intermediate layer 143a is greater than 3:1, the thickness of the first layer 141 is relatively too large, and stress may be increased.

A thickness ratio of the first intermediate layer 143a to the second intermediate layer 143b may be in the range of 1:1 to 1:3. When the thickness ratio of the first intermediate layer 143a to the second intermediate layer 143b is less than 1:1, a material included in the first intermediate layer 143a may be diffused. When the thickness ratio of the first intermediate layer 143a to the second intermediate layer 143b is greater than 1:3, the thickness of the second intermediate layer 143b is relatively too large, and stress may be increased.

Figure 4:
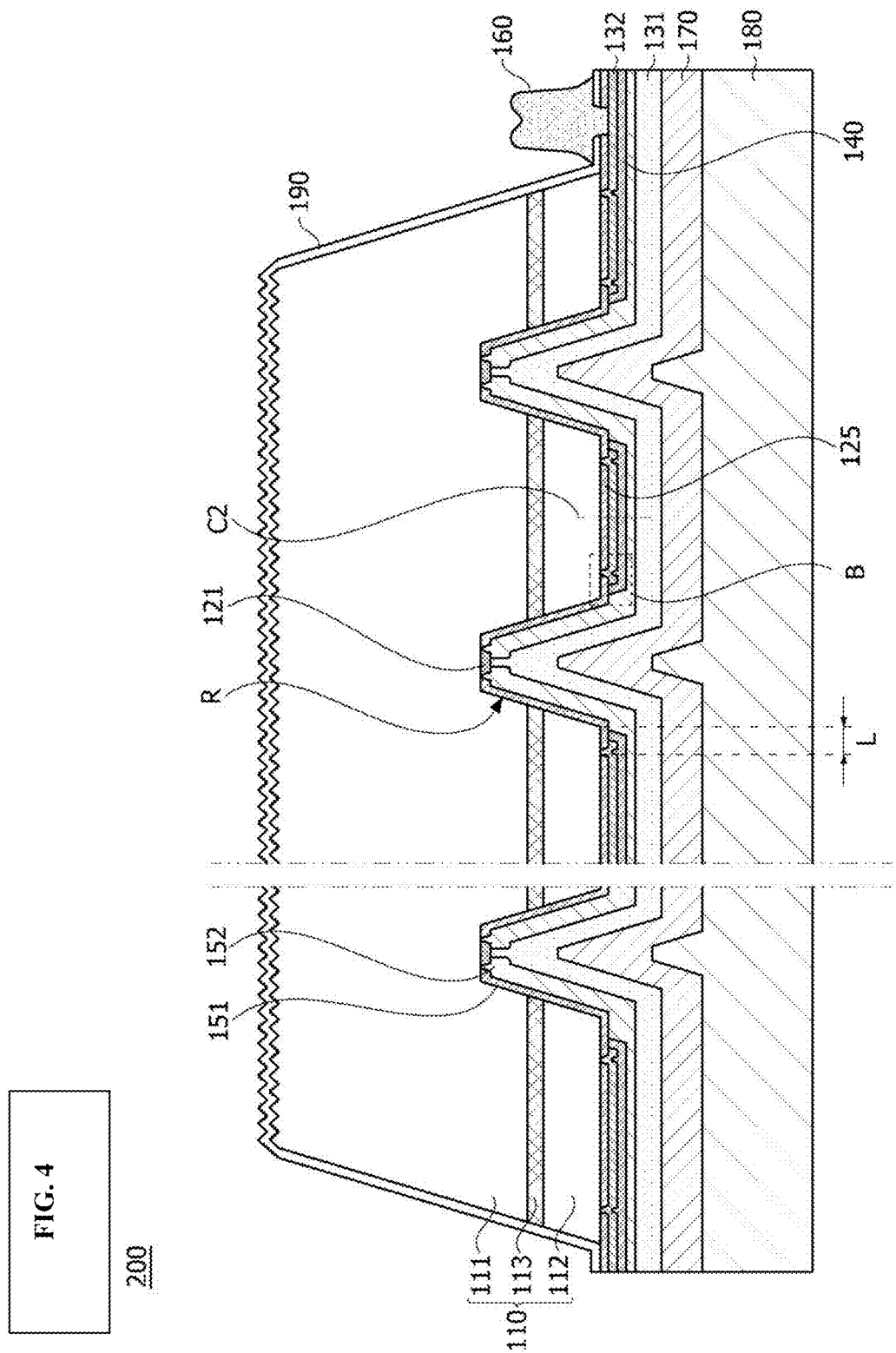
FIG. 4 is a conceptual view of a semiconductor device according to a second embodiment of the present invention.
Figure 5A:
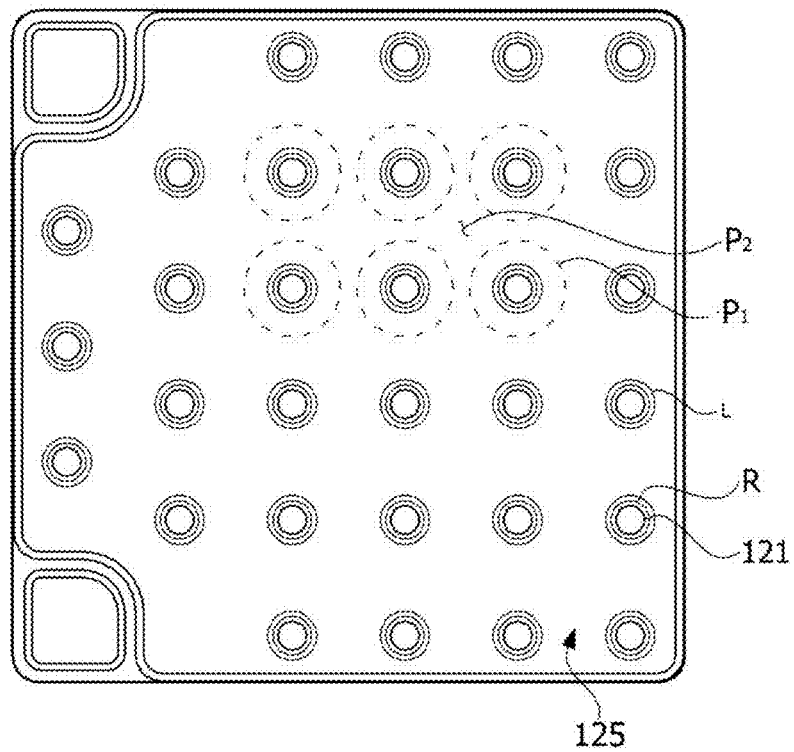
FIGS. 5A and 5B are configuration views for describing optical output being improved according to a change in the number of recesses.
Figure 5B:
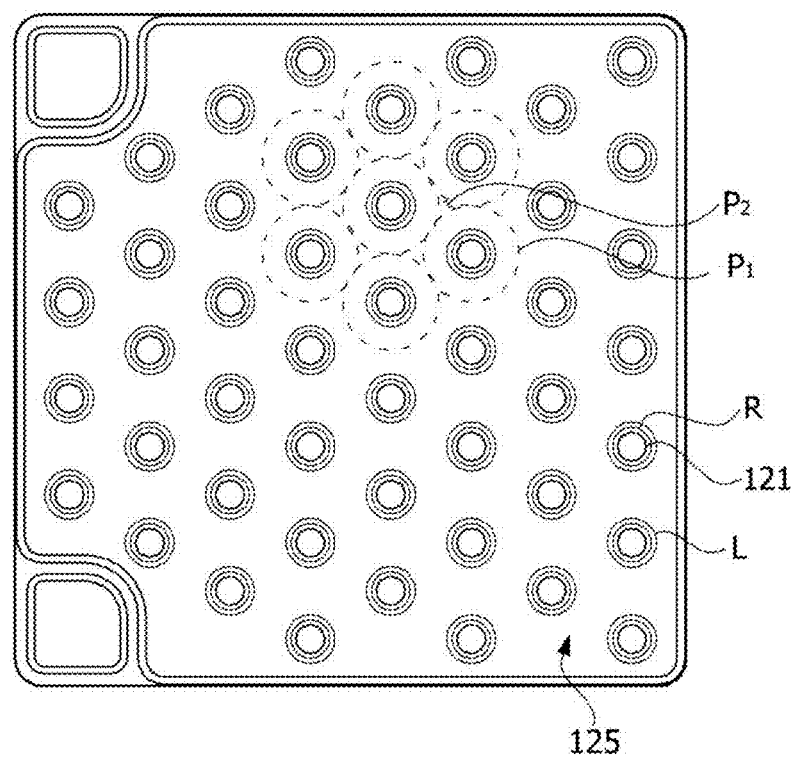
Figure 6A:
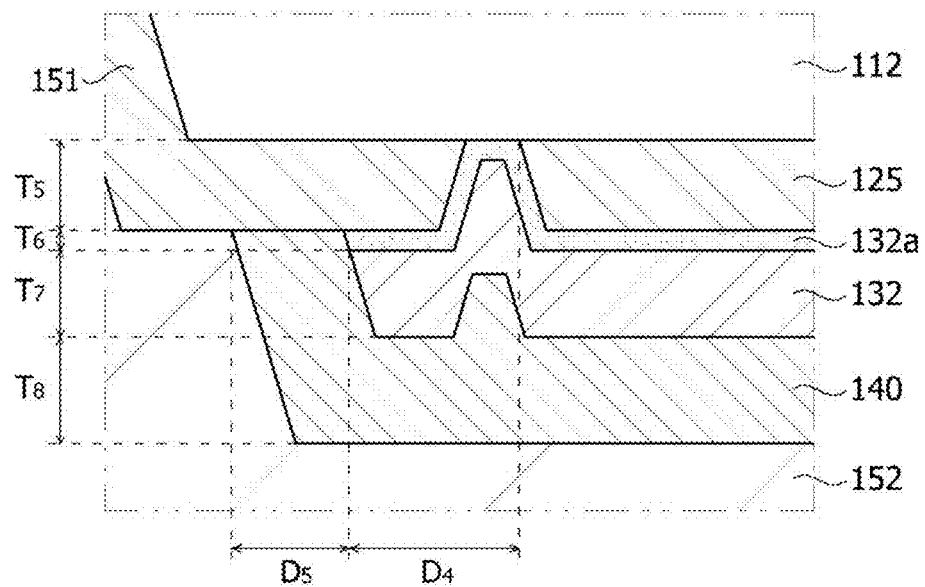
FIG. 6A is an enlarged view of a portion B of FIG. 4.
Figure 6B:
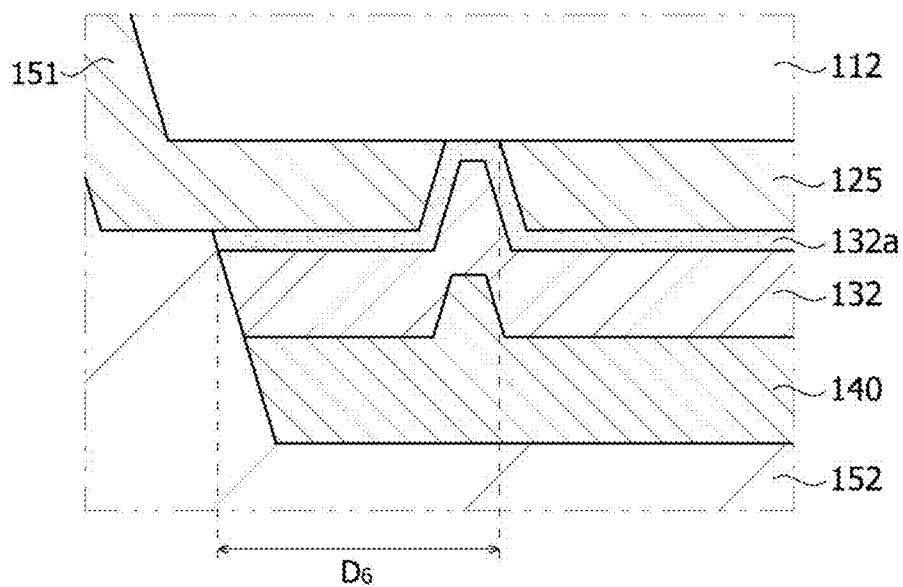
FIG. 6B shows a modified example of FIG. 6A.

FIG. 4 is a conceptual view of a semiconductor device according to a second embodiment of the present invention. FIGS. 5A and 5B are configuration views for describing optical output being improved according to a change in the number of recesses. FIG. 6A is an enlarged view of a portion B of FIG. 4. FIG. 6B shows a modified example of FIG. 6A.

Referring to FIG. 4, a semiconductor device 200 may include a light-emitting structure 110, a plurality of recesses R, first electrodes 121, a second electrode 125, a reflective layer 132, and a capping layer 140.

The light-emitting structure 110 may have the same configuration as the light-emitting structure 110 described in FIG. 1. Prominences and depressions may be formed on the upper surface of the light-emitting structure 110. These prominences and depressions may improve the extraction efficiency of light emitted from the light-emitting structure 110. The prominences and depressions may have an average height varying according to ultraviolet wavelength. The prominences and depressions may have a height of about 300 nm to about 800 nm in the case of UV-C, and the light extraction efficiency may be improved when the average height is about 500 nm to about 600 nm.

The plurality of recesses R may extend to a partial region of the first conductive semiconductor layer 111 through one surface of the second conductive semiconductor layer 112 and the active layer 113. In the recesses R, first insulating layers 151 and a second insulating layer 152 may be disposed to electrically insulate a first conductive layer 131 from the second conductive semiconductor layer 112 and the active layer 113.

The first electrodes 121 may be disposed on upper surfaces of the recesses R and electrically coupled to the first conductive semiconductor layer 111. The first electrodes 121 may be exposed by the first insulating layers 151 and electrically coupled to the first conductive semiconductor layer 111. The first electrodes 121 may be electrically insulated from the active layer 113 and the second conductive semiconductor layer 112 by the first insulating layers 151. The first electrodes 121 may be ohmic electrodes.

The first electrodes 121 may be formed to include at least one of ITO, IZO, IZTO, IAZO, IGZO, IGTO, AZO, ATO, GZO, IZON, AGZO, ZnO, IrOx, RuOx, NiO, RuOx/ITO, Ni/IrOx/Au, Ni/IrOx/Au/ITO, Ah, Ni, Cr, Ti, Al, Rh, Pd, Ir, Sn, In, Ru, Mg, Zn, Pt, Au, and Hf but is not limited to these materials.

The second electrode 125 may be formed on the second conductive semiconductor layer 112. The second electrode 125 is exposed by the first insulating layers 151 and electrically coupled to the second conductive semiconductor layer 112. The second electrode 125 may be an ohmic electrode. The second electrode 125 may have the same configuration as disclosed in FIG. 1.

As described above, a surface layer of the second conductive semiconductor layer 112 which is in contact with the second electrode 125 has an Al composition of 1% to 10%, and accordingly, current injection may be easy.

The first conductive layer 131 may be disposed according to shapes of a lower surface of the light-emitting structure 110 and the recesses R. The first conductive layer 131 may be electrically insulated from the capping layer 140 by the second insulating layer 152. The first conductive layer 131 may be electrically coupled to the first electrodes 121 by passing through the second insulating layer 152.

The first conductive layer 131 may be formed of a material with high reflectance. For example, the first conductive layer 131 may include Al. When the first conductive layer 131 includes Al, the first conductive layer 131 serves to reflect light emitted from the active layer 113 upward so that the light extraction efficiency may be improved.

The second conductive layer (also described as a reflective layer) 132 may be disposed on the second electrode 125. The reflective layer 132 may be disposed to cover the second electrode 125. The reflective layer 132 may be electrically coupled to the second electrode 125. The reflective layer 132 may be in contact with side surfaces and lower surfaces of the first insulating layers 151. When the reflective layer 132 is in contact with the side surfaces and the lower surfaces of the first insulating layers 151, the thermal and electrical reliability of the second electrode 125 may be improved. Also, the reflective layer 132 may be formed of a material with high reflectance. For example, the reflective layer 132 may include Al, Ag, Au, or Cu. The reflective layer 132 may be formed of a material having high adhesive strength with the first insulating layers 151. The reflective layer 132 may improve light extraction efficiency by reflecting light emitted between the first insulating layers 151 and the second electrode 125 upward. The reflective layer 132 may have the same configuration as disclosed in FIG. 1.

The capping layer 140 may be disposed on the reflective layer 132. The capping layer 140 may be disposed to cover the reflective layer 132. The capping layer 140 may have the same configuration as disclosed in FIG. 1. Also, the capping layer 140 may have any one configuration selected from among FIGS. 3A to 3D.

The first insulating layers 151 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like but is not limited thereto. The first insulating layer 151 and the second insulating layer 152 may be formed as a single layer or multiple layers. For example, the first and second insulating layers 151 and 152 may be multilayer distributed Bragg reflectors (DBRs) including Si oxide or a Ti compound. However, the first and second insulating layers 151 and 152 are not necessarily limited thereto and may include various reflective structures.

When the first and second insulating layers 151 and 152 perform a reflection function, it is possible to improve light extraction efficiency by reflecting light emitted toward side surfaces of the first and second insulating layers 151 and 152 upward. When the number of recesses R increases, the ultraviolet semiconductor device may exhibit a higher light extraction efficiency than a semiconductor device which emits blue light.

In particular, a change in optical output made according to the number of recesses will be described below with reference to FIGS. 5A and 5B.

FIGS. 5A and 5B may be plan views of the semiconductor device 200 of FIG. 4 in which the light-emitting structure 110 has been omitted. In other words, the first electrodes 121 may be disposed at the centers of the recesses R. Also, the recesses R may be spaced apart from the second electrode 125 by a separation region L.

When an Al composition in the light-emitting structure 110 increases, a current-spreading characteristic in the light-emitting structure 110 may be degraded. Also, the amount of light emitted from a side surface of the active layer 113 is increased (a transverse magnetic (TM) mode) as compared to the amount of light emitted from a GaN-based blue light-emitting device. Such a TM mode may be generated from the ultraviolet semiconductor device.

The ultraviolet semiconductor device has a current distribution characteristic inferior to that of a blue GaN semiconductor device. Therefore, in an ultraviolet semiconductor device, it is necessary to form a larger number of recesses R than in a blue GaN semiconductor device and dispose the first electrodes 121.

Referring to FIG. 5A, a current is distributed only in the vicinity of each of the first electrodes 121, and the current density may be drastically reduced at a location far therefrom. Therefore, effective light-emitting regions P1 may be reduced in size.

An effective light-emitting region P1 may be defined to be a region from the center of the first electrode at which the current density is the highest to a boundary at which the current density is 40% or less. For example, the effective light-emitting region P1 may be adjusted according to an injection current level and an Al composition within a range of 40 μm from the center of a recess R.

A low current density region P2 has a low current density and, accordingly, may barely contribute to light emission. Therefore, according to the embodiment, an optical output may be improved by additionally disposing a first electrode 121 in the low current density region P2 having a low current density or by using a reflective structure.

In general, a GaN-based semiconductor device which emits blue light has a superior current distribution characteristic, and accordingly, it is preferable to minimize areas of the recesses R and the first electrodes 121. This is because the area of the active layer 113 is reduced when the areas of the recesses R and the first electrodes 121 increase.

However, according to the embodiment, the current distribution characteristic is relatively inferior due to a high Al composition. Therefore, it is preferable to reduce the low current density region P2 by increasing the number of first electrodes 121 even by compromising the area of the active layer 113 or to dispose a reflective structure in the low current density region P2.

Referring to FIG. 5B, when the number of recesses R is 48, the recesses R may be disposed in a horizontal or vertical straight line and may be disposed in a zigzag form. In this case, the area of the low current density region P2 is further reduced, and most of the active layer may participate in light emission.

When the number of recesses R is 70 or 110, a current may be distributed more efficiently. Therefore, the operating voltage may be lowered, and the optical output may be improved. In a semiconductor device which emits UV-C, when the number of recesses R is less than 70, electro-optical characteristics may be degraded. When the number of recesses R is greater than 110, electrical characteristics may be improved, but optical characteristics may be degraded due to a reduction in the volume of a light-emitting layer. In this case, the recesses R may have a diameter of 20 μm to 70 μm.

Meanwhile, a second electrode pad 160 may be disposed in one corner region of the semiconductor device 200. The second electrode pad 160 may be electrically coupled to the reflective layer 132 and the second electrode 125 by the first insulating layer 151. In other words, the second electrode pad 160, the reflective layer 132, and the second electrode 125 may constitute one electrical channel. Also, the second electrode pad 160 may be electrically insulated from the first conductive layer 131 by the second insulating layer 152.

The center of the second electrode pad 160 is recessed such that an upper surface thereof may have a concave portion and a convex portion. A wire (not shown) may be bonded to the concave portion of the second electrode pad 160. Therefore, the wire may be firmly bonded to the second electrode pad 160 due to a large adhesive area.

The second electrode pad 160 may serve to reflect light. Therefore, when the second electrode pad 160 is closer to the light-emitting structure 110, the light extraction efficiency of the semiconductor device 200 may be improved. Also, the height of the convex portion of the second electrode pad 160 may be greater than that of the active layer 113. Therefore, the second electrode pad 160 may improve the light extraction efficiency by reflecting light emitted in a horizontal direction of the device from the active layer 113 and control a beam angle.

A bonding layer 170 may be additionally disposed along the shapes of the lower surface of the light-emitting structure 110 and the recesses R. The bonding layer 170 may include a conductive material. For example, the bonding layer 170 may include a material selected from the group consisting of Au, Sn, In, Al, Si, Ag, Ni, and Cu, or an alloy thereof.

A substrate 180 may be disposed on the bonding layer 170. The substrate 180 may be formed of a conductive material. For example, the substrate 180 may include a metal or semiconductor material. Also, the substrate 180 may be a metal with excellent electrical conductivity and/or thermal conductivity. For example, the substrate 180 may include a material selected from the group consisting of Si, Mo, W, Cu, and Al, or an alloy thereof. In this case, it is possible to rapidly transfer heat generated during operation of the semiconductor device to the outside.

A passivation layer 190 may be formed on an upper surface and side surfaces of the light-emitting structure 110. The passivation layer 190 may be in contact with the first insulating layer 151 in an area adjacent to the second electrode 125.

Referring to FIG. 6A, an end of the second electrode 125 may be spaced a separation distance D4 from an end of the reflective layer 132. Specifically, a distance from a center C2 (see FIG. 4) of the second electrode 125 to the end of the reflective layer 132 may be greater than a distance from the center C2 of the second electrode 125 to the end of the second electrode 125. Since the reflective layer 132 extends to cover a side surface of the second electrode 125, light emitted toward the side surface of the second electrode 125 may be reflected upward such that the light extraction efficiency may be improved.

The separation distance D4 between the end of the second electrode 125 and the end of the reflective layer 132 may be in the range of 2.5 µm to 5 µm. When the separation distance D4 is less than 2.5 µm, the reflectance may be reduced. When the separation distance D4 is greater than 5 µm, stress on the corner of the reflective layer 132 may be increased, and the reflection efficiency may be barely improved.

The end of the reflective layer 132 may be spaced a separation distance D5 from an end of the capping layer 140. Specifically, a distance from the center C2 (see FIG. 4) of the reflective layer 132 to the end of the capping layer 140 may greater than a distance from the center C2 of the reflective layer 132 to the end of the reflective layer 132. Since the capping layer 140 extends to cover a side surface of the reflective layer 132, it is possible to protect the reflective layer 132.

The separation distance D5 between the end of the reflective layer 132 and the end of the capping layer 140 may be in the range of 2.5 µm to 5 µm. When the separation distance D5 is less than 2.5 µm, the current injection efficiency and the reflective layer protection effect may be degraded. When the separation distance D5 is greater than 5 µm, stress on the corner of the capping layer 140 may be increased.

FIG. 6B shows the modified example of FIG. 6A.

Referring to FIG. 6B, the end of the second electrode 125 may be spaced a separation distance D6 from the end of the reflective layer 132. The separation distance D6 may be in the range of 2.5 µm to 5 µm. Also, the end of the second electrode 125 and the end of the capping layer 140 may be spaced apart from each other by a smaller separation distance than the separation distance D6. It is self-evident that the end of the second electrode 125 may be spaced the separation distance D6 from the end of the capping layer 140.

In other words, in FIG. 6B, the end of the capping layer 140 may be formed close to the center C2 (see FIG. 4) as compared to the end of reflective layer 132 Also, the ends of the reflective layer 132 and the capping layer 140 may be collinear. This is because side surfaces of the reflective layer 132 have little influence on the reflection efficiency and it may be meaningless to cover the side surfaces with the capping layer 140.

In other words, in the embodiment of the present invention, the reflective layer 132 is disposed to completely cover the second electrode 125 and may thereby contribute to an increase in the reflectance. Also, the capping layer 140 is disposed to cover the upper surface of the reflective layer 132 or the entire reflective layer 132 such that a protection effect for the reflective layer 132 may be improved.

<Experimental Example>

Reflective Layer Observation

Figure 7A:
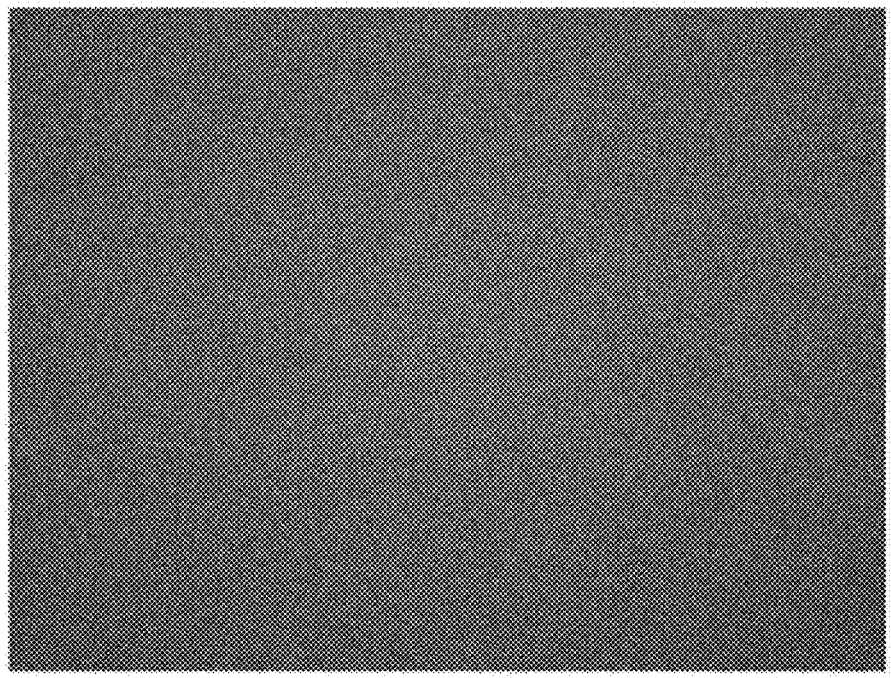
FIGS. 7A and 7B show reflective layers observed before and after a structure of a capping layer in a semiconductor device is changed.
Figure 7B:
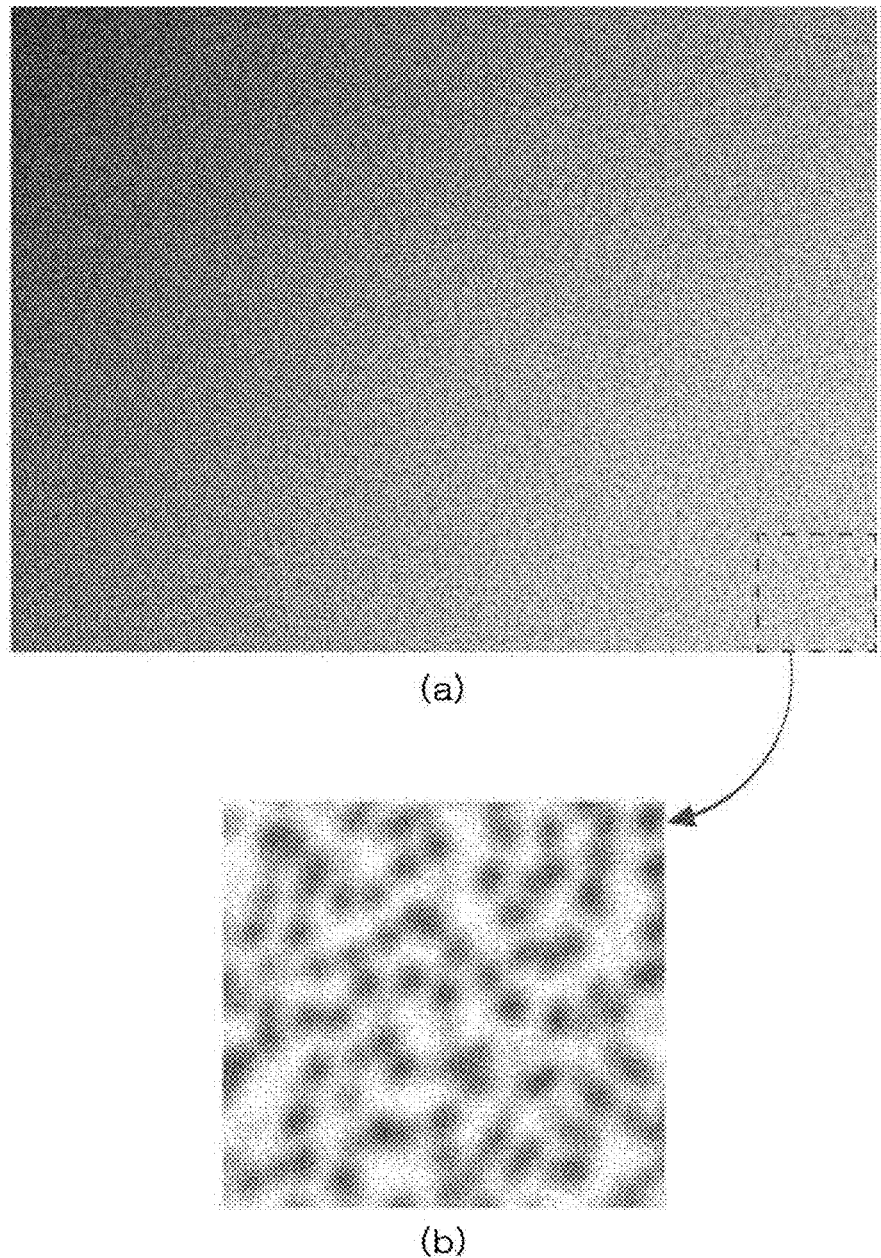

FIGS. 7A and 7B show reflective layers observed before and after a structure of a capping layer in a semiconductor device is changed.

In FIG. 7A, a capping layer was configured as disclosed in the present invention, and in FIG. 7B, an intermediate layer of the capping layer was configured in a different manner. In other words, FIGS. 7A and 7B show results of observing samples with an optical microscope after the samples were fabricated to have different structures of capping layers and were subjected to a thermal process at 300° C. FIG. 7A shows a result of observing a reflective layer through an optical microscope with a magnification of 200×. FIG. 7B(A) shows a result of observing a reflective layer through an optical microscope with a magnification of 200×, and FIG. 7B(B) shows a result of observing the reflective layer with a magnification of 1000×.

More specifically, in the case of FIG. 7A, a second electrode/a bonding layer/a reflective layer/a capping layer were formed of ITO/Cr/Al/Ti/Ni/Ti/Ni/Au. In the case of FIG. 7B, a second electrode/a bonding layer/a reflective layer/a capping layer were formed of ITO/Cr/Al/Ni/Ti/Ni/Au. In other words, in the case of FIG. 7A, a layer of the capping layer (a first layer) which was in direct contact with the reflective layer was formed of Ti, and in the case of FIG. 7B, a layer of the capping layer which was in direct contact with the reflective layer was formed of Ni.

Referring to FIG. 7A, when the first layer of the capping layer was formed of Ti, no dark spots were observed on the reflective layer. In other words, the first layer may prevent materials of the capping layer (e.g., Ni) from being diffused into the reflective layer.

Referring to FIG. 7B, when the first layer of the capping layer was formed of Ni, multiple dark spots were observed on the reflective layer. In other words, since the first layer was formed of Ni, materials existing in the capping layer (e.g., Ni) were diffused into the reflective layer, and dark spots (Ni diffused into the reflective layer) were observed. In particular, in the case of FIG. 7B, the reflective layer and the first layer (Ni) were in direct contact with each other, and accordingly, Ni was easily diffused.

Reflectance Measurement

Table 1 shows reflectance measured from a structure of a second electrode/a bonding layer/a reflective layer/a capping layer (a first layer). Ni was used for the first layer in Comparative examples 1 and 2, and Ti was used for the first layer in Embodiment 1. Comparative example 1 shows reflectance before a thermal process, and Comparative example 2 and Embodiment 1 show reflectance after the thermal process.

TABLE 1

|  | Structure | Reflectance(%) @280 nm |
| --- | --- | --- |
| Comparative example 1 | ITO/Cr/Al/Ni | 41.2 |
| Comparative example 2 (thermal process) | ITO/Cr/Al/Ni | 35.7 |
| Embodiment 1 (thermal process) | ITO/Cr/Al/Ti | 49.8 |

Referring to Comparative examples 1 and 2, it is possible to see that although the structures were formed of the same material, reflectance was reduced after the thermal process. This is because diffusion of Ni may be activated by the thermal process. In other words, many dark spots were generated after the thermal process, and reflectance was reduced accordingly. Since a semiconductor device may be exposed to high temperature during several processes, it is important to ensure an appropriate level of reflectance after the thermal process.

Although the reflectance of Embodiment 1 was measured after the thermal process, the reflectance was higher than that of Comparative example 1 which was measured before the thermal process. In other words, by applying Ti to the capping layer (the first layer), it was possible to prevent the generation of dark spots in the reflective layer and obtain increased reflectance.

As described above, in the embodiment of the present invention, a first layer of a capping layer which is in direct contact with a reflective layer may be formed of Ti. According to the present invention, the first layer may prevent materials in the capping layer from being diffused into the reflective layer. Therefore, reflectance may be increased by preventing dark spots from being generated in the reflective layer.

Figure 8A:
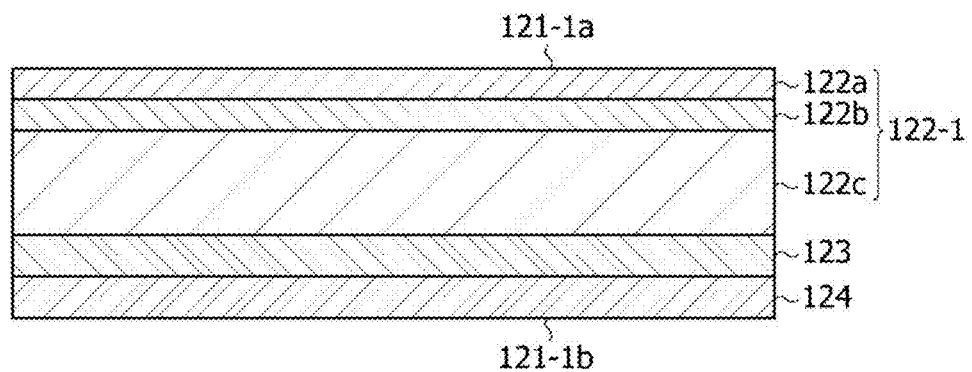
FIGS. 8A and 8B show various modified examples of a first electrode in a semiconductor device according to an embodiment of the present invention.
Figure 8B:
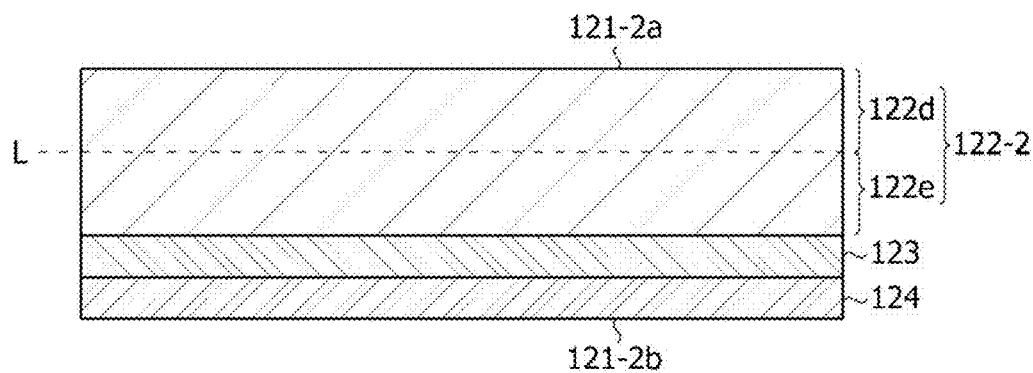

FIGS. 8A and 8B show various modified examples of a first electrode in a semiconductor device according to an embodiment of the present invention.

First, a first electrode according to a first embodiment will be described below with reference to FIG. 8A.

A first electrode 121-1 may be in ohmic contact with the first conductive semiconductor layer 111 (see FIG. 1) and include at least one conductive material. The first electrode 121-1 may include a plurality of layers. The first electrode 121-1 may include a first surface 121-1a which is in contact with the first conductive semiconductor layer 111 and a second surface 121-1b which is in contact with the first conductive layer 131.

The first electrode 121-1 may include a first layer 122-1, a second layer 123, and a third layer 124. The first layer 122-1 may include a $1^{st}$-1 layer 122a, a $1^{st}$-2 layer 122b, and a $1^{st}$-3 layer 122c. The $1^{st}$-1 layer 122a, the $1^{st}$-2 layer 122b, the $1^{st}$-3 layer 122c, the second layer 123, and the third layer 124 may be sequentially disposed.

The $1^{st}$-1 layer 122a, the $1^{st}$-2 layer 122b, and the $1^{st}$-3 layer 122c of the first electrode 121-1, the second layer 123, and the third layer 124 may be sequentially deposited and then subjected to a thermal process. After the thermal process, metal materials in the first layer 122-1 may be mixed together. This will be described in further detail below with reference to FIG. 8B.

Meanwhile, after the thermal process of the first electrode 121-1, a ball-up phenomenon may occur and voids may be generated in the first electrode 121-1. In particular, the ball-up phenomenon may occur on the second surface 121-1b of the first electrode 121-1.

This is because a first metal (e.g., Al) included in the $1^{st}$-3 layer 122c and a third metal (e.g., Au) included in the third layer 124 have different diffusion coefficients. The diffusion coefficients indicate the degrees of diffusion per unit time. As a diffusion coefficient increases, a diffusion velocity may increase. In other words, the first metal has a larger diffusion coefficient than the third metal and may have a higher diffusion velocity than the third metal. In other words, the first metal may have a characteristic in that it tends to be diffused toward the third layer 124.

Therefore, the first metal material may move from a partial region of the first layer 122-1 having a high ratio of the first metal toward the third layer 124. As the first metal material moves, the ball-up phenomenon may occur in some regions of the $1^{st}$-3 layer 122c, the second layer 123, and the third layer 124. Also, Kirkendall voids, which are empty spots from which the first metal material has been moved, may be generated under ball-up regions.

The ball-up phenomenon may degrade the efficiency of the semiconductor device. In other words, current may be concentrated in a ball-up region. Also, the first electrode 121-1 may be corroded along ball-up regions (or void regions). This may degrade the ohmic characteristics of the first electrode 121-1. In order to prevent this, it is preferable to maintain the ohmic characteristics and also minimize the generation of voids by appropriately controlling the thicknesses of the components of the first electrode 121, particularly, the $1^{st}$-3 layer 122c and the second layer 123.

The first layer 122-1 may be exposed by the first insulating layer 151 and electrically coupled to the first conductive semiconductor layer 111. The first layer 122-1 may be electrically coupled to the first conductive semiconductor layer 111 through the first surface 121-1a. The first layer 122-1 may include Cr, Ti, and Al. In this case, the ohmic characteristics of the first electrode 121-1 may be controlled by the Al. When the amount of Al increases, the ohmic characteristics may be improved, but the ball-up phenomenon may occur more frequently. Therefore, when the amount of Al exceeds an appropriate level and becomes excessive, ohmic contact may not be made due to an increase in the number of ball-ups and voids.

In the first layer 122-1, the first metal layer (the $1^{st}$-3 layer) 122c including the first metal (e.g., Al) has a thickness of 100 nm to 120 nm. When the thickness of the $1^{st}$-3 layer 122c is less than 100 nm, the ohmic characteristics may be degraded. When the thickness of the $1^{st}$-3 layer 122c is greater than 120 nm, the ball-up phenomenon (voids) may occur.

Meanwhile, the thickness of the $1^{st}$-3 layer 122c may be in the range of 1.5 to 2.5 times the sum of thicknesses of the $1^{st}$-1 layer 122a and $1^{st}$-2 layer 122b. When the thickness of the $1^{st}$-3 layer 122c deviates from this ratio and is relatively too small or large in the first layer 122-1, ohmic contact may not be made.

The plurality of layers included in the first layer 122-1 may include different metal materials. For example, the $1^{st}$-1 layer 122a may include Cr, and the $1^{st}$-2 layer 122b may include Ti. However, the present invention is not limited thereto.

The second layer 123 may be disposed on the first layer 122-1. Specifically, the second layer 123 may be disposed on the $1^{st}$-3 layer 122c. The second layer 123 may serve as a barrier between the first layer 122-1 and the third layer 124. In particular, the second layer 123 may prevent diffusion caused by a difference in diffusion coefficient between the $1^{st}$-3 layer 122c and the third layer 124. The second layer 123 may include a second metal (e.g., Ni). When a layer including Ni becomes thicker, the ball-up phenomenon may occur less frequently, but the ohmic characteristics may be degraded.

The second layer 123 may have a thickness of 45 nm to 65 nm. When the thickness of the second layer 123 is less than 45 nm, the first metal of the first layer 122-1 may be diffused toward the third layer 124 such that voids may be generated and the ball-up phenomenon may occur. When the thickness of the second layer 123 is greater than 65 nm, the ohmic characteristics may be degraded.

The thickness of the second layer 123 may be in the range of 0.4 to 0.53 times the thickness of the $1^{st}$-3 layer 122c. When the thickness of the second layer 123 is less than 0.4 times the thickness of the $1^{st}$-3 layer 122c, the ball-up phenomenon may occur, and voids may be generated. In other words, the second layer 123 serving as a barrier has a small thickness in relation to the $1^{st}$-3 layer 122c and thus may not properly prevent diffusion. When the thickness of the second layer 123 is greater than 0.53 times the thickness of the $1^{st}$-3 layer 122c, the ohmic characteristics may be degraded. In other words, the thickness of the $1^{st}$-3 layer 122c which controls the ohmic characteristics becomes relatively small, and accordingly, the ohmic characteristics may be degraded.

The third layer 124 may be disposed on the second layer 123. The third layer 124 may be electrically coupled to the first conductive layer 131 through the second surface 121-1b. The third layer 124 may include Au, but the present invention is not limited thereto.

The first electrode according to the second embodiment will be described below with reference to FIG. 8B.

The first electrode 121-2 is in ohmic contact with the first conductive semiconductor layer 111 (see FIG. 1) and may include at least one conductive material. The first electrode 121-2 may include a plurality of layers. The first electrode 121-2 may include a first surface 121-2a which is in contact with the first conductive semiconductor layer 111 and a second surface 121-2b which is in contact with the first conductive layer 131.

The first electrode 121-2 may include a first layer 122-2, a second layer 123, and a third layer 124. The first layer 122-2 may include a first region 122d and a second region 122e.

The first electrode 121-2 of FIG. 8B may be obtained by thermally processing the first electrode 121-1 of FIG. 8A. After the thermal process, metals included in the first layer 122-1 of the first electrode 121-1 (see FIG. 8A) are mixed such that the first layer 122-2 of the first electrode 121-2 (see FIG. 8B) may be obtained.

The first layer 122-2 may be exposed by the first insulating layer 151 and electrically coupled to the first conductive semiconductor layer 111. The first layer 122-2 may be electrically coupled to the first conductive semiconductor layer 111 through the first surface 121-2a. The first layer 122-2 may include Cr, Ti, and Al. n this case, the ohmic characteristics of the first electrode 121-2 may be controlled by the Al.

The first layer 122-2 may include the first region 122d and the second region 122e. The first region 122d may be a region from the first surface 121-2a to a virtual line L in the first layer 122-2. The second region 122e may be a region from the virtual line L to an interface between the first layer 122-2 and the second layer 123.

Both the first region 122d and the second region 122e may include Cr, Ti, and Al. In this case, an Al (the first metal) ratio in the first region 122d may be less than an Al ratio in the second region 122e. Also, the sum of Cr and Ti ratios in the first region 122d may be greater than the sum of Cr and Ti ratios in the second region 122e.

This is because the first region 122d is disposed in a region corresponding to the 1$^{st}$-1 layer 122a and the 1$^{st}$-2 layer 122b in the first layer 122-1 before the thermal process (see FIG. 8A). In other words, even when metal materials in the first layer 121-2 (see FIG. 8A) are diffused and mixed together by the thermal process, Cr and Ti which have existed in the 1$^{st}$-1 layer 122a and the 1$^{st}$-2 layer 122b may be present more in the region (the first region) in which the 1$^{st}$-1 layer 122a and the 1$^{st}$-2 layer 122b have been disposed.

Also, the second region 122e may be disposed in a region corresponding to the 1st-3 layer 122c before the thermal process. Therefore, even when metal materials in the first layer 122-2 (see FIG. 8A) are diffused and mixed together by the thermal process, Al which has existed in the 1$^{st}$-3 layer 122c may be present in a relatively large amount in the region (the second region) in which the 1$^{st}$-3 layer 122c has been disposed.

The virtual line L may be positioned at a point at which the first region 122d and the second region 122e are divided in a ratio of 3:7 to 6.5:3.5 in the first layer 122-2. In other words, a thickness ratio of the first region 122d to the second region 122e in the first layer 122-2 may be in the range of 3:7 to 6.5:3.5. This is because, as described above, the thickness of the 1$^{st}$-3 layer 122c is in the range of 1.5 to 2.5 times the sum of thicknesses of the 1$^{st}$-1 layer 122a and the 1$^{st}$-2 layer 122b.

Also, a ratio of an Al ratio of the first region 122d to an Al ratio of the second region 122e may be in the range of 1:1.5 to 1:2.5. This is because, as described above, the thickness of the 1$^{st}$-3 layer 122c before the thermal process (see FIG. 8A) is in the range of 1.5 to 2.5 times the sum of thicknesses of the 1$^{st}$-1 layer 122a and the 1$^{st}$-2 layer 122b. In other words, this is because the thickness of the 1$^{st}$-3 layer 122c is greater than the sum of the thicknesses of the 1$^{st}$-1 layer 122a and the 1$^{st}$-2 layer 122b, and accordingly, Al which has been included in the 1$^{st}$-3 layer 122c remains in large amounts in the second region 122e.

The second layer 123 may be disposed on the first layer 122-2. Specifically, the second layer 123 may be disposed on the second region 122e. The second layer 123 may serve as a barrier between the first layer 122-2 and the third layer 124. In particular, the second layer 123 may prevent diffusion caused by a difference in diffusion coefficient between the first metal (e.g., Al) included in the first layer 122-2 and the third metal (e.g., Au) included in the third layer 124. The second layer 123 may include the second metal (e.g., Ni).

The second layer 123 may have a thickness of 45 to 65 nm. When the thickness of the second layer 123 is less than 45 nm, the first metal of the first layer 122-2 may be diffused toward the third layer 124 such that voids may be generated and the ball-up phenomenon may occur. When the thickness of the second layer 123 is greater than 65 nm, ohmic characteristics may be degraded.

The third layer 124 may be disposed on the second layer 123. The third layer 124 may be electrically coupled to the first conductive layer 131 through the second surface 121-2b. The third layer 124 may include Au, but the present invention is not limited thereto.

As described above, according to the present invention, it is possible to maintain ohmic characteristics and also suppress the ball-up phenomenon and minimize the generation of voids by appropriately controlling the thickness of a layer including Al by which the ohmic characteristics are controlled and the thickness of a layer including Ni serving as a barrier.

<Experimental Example>

Comparison of Contact Resistivity, Surface Characteristics, and Ohmic Characteristics A first electrode was formed in a structure of a 1$^{st}$-1 layer/1$^{st}$-2 layer/a first metal layer (a 1$^{st}$-3 layer)/a second layer/a third layer. Here, Comparative example 1, Embodiment 1, Embodiment 2, and Embodiment 3 were configured by changing thicknesses of the first metal layer and the second layer. The first metal layer may include Al, and the second layer may include Ni. The first electrode may be subjected to a thermal process.

Table 2 shows thicknesses and transmission line measurement (TLM)-based contact resistivity values of Comparative example 1, Embodiment 1, Embodiment 2, and Embodiment 3.

TABLE 2

|  | Comparative example 1 | Embodiment 1 | Embodiment 2 | Embodiment 3 |
|---|---|---|---|---|
| Al(nm) | 130 | 100 | 120 | 120 |
| Ni(nm) | 52 | 52 | 52 | 63 |
| Contact resistivity $\sigma_c$ | 1.84·E−03 | 1.84·E−03 | 9.78·E−04 | 5.86·E−03 |

Figure 9A:
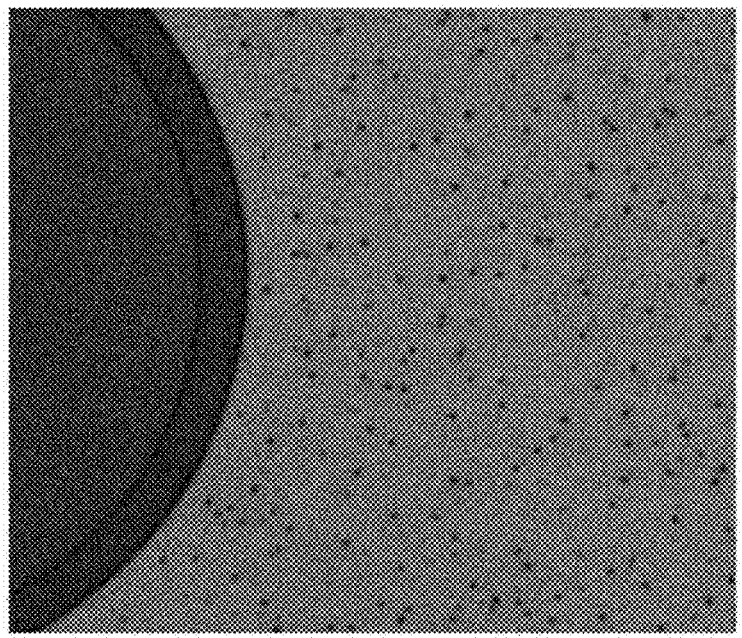
FIGS. 9A to 9D show a ball-up phenomenon observed in different configurations of a first electrode in a semiconductor device according to an embodiment of the present invention.
Figure 9B:
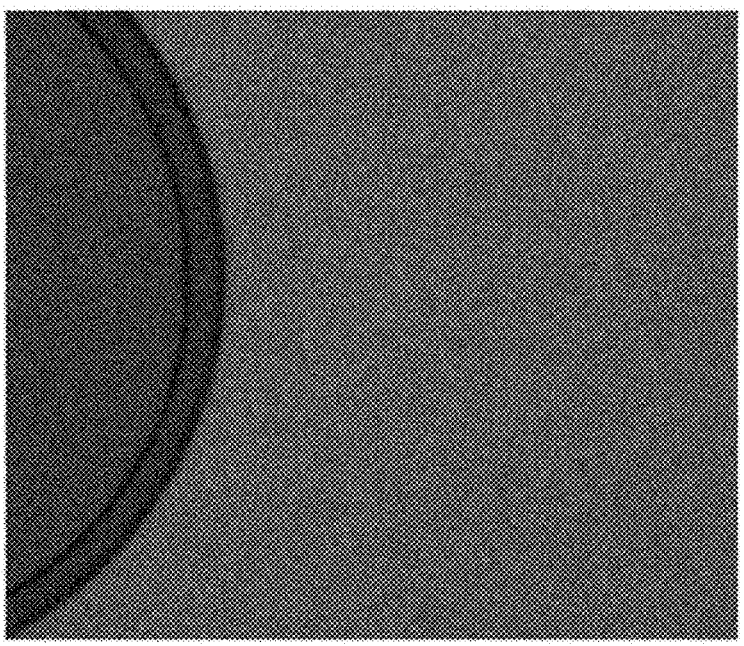
Figure 9C:
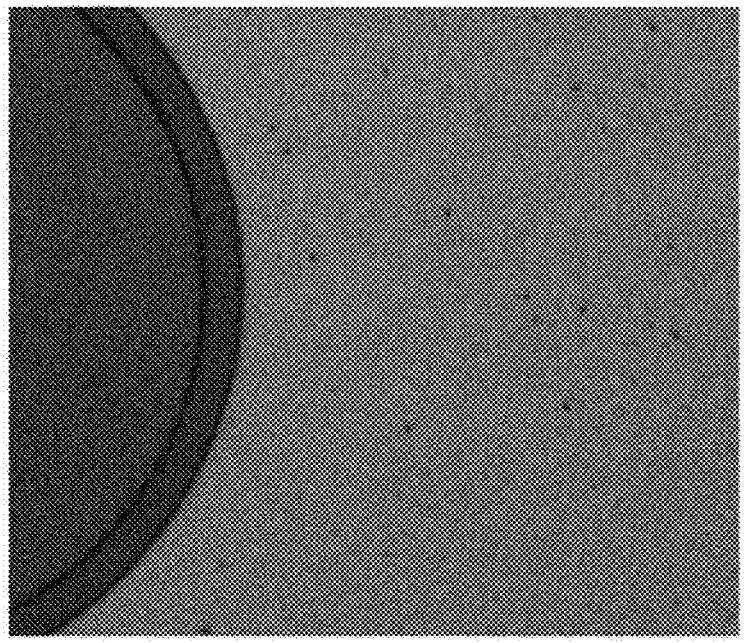
Figure 9D:
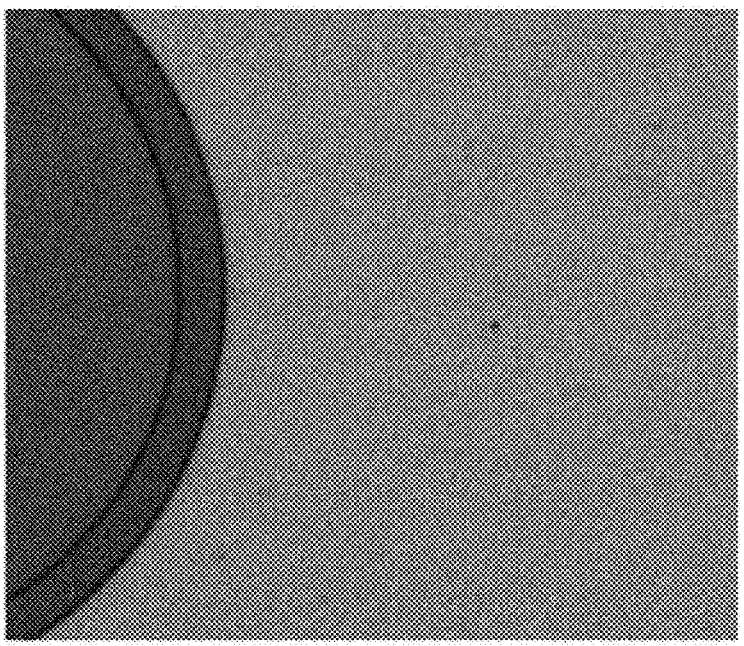
Figure 10:
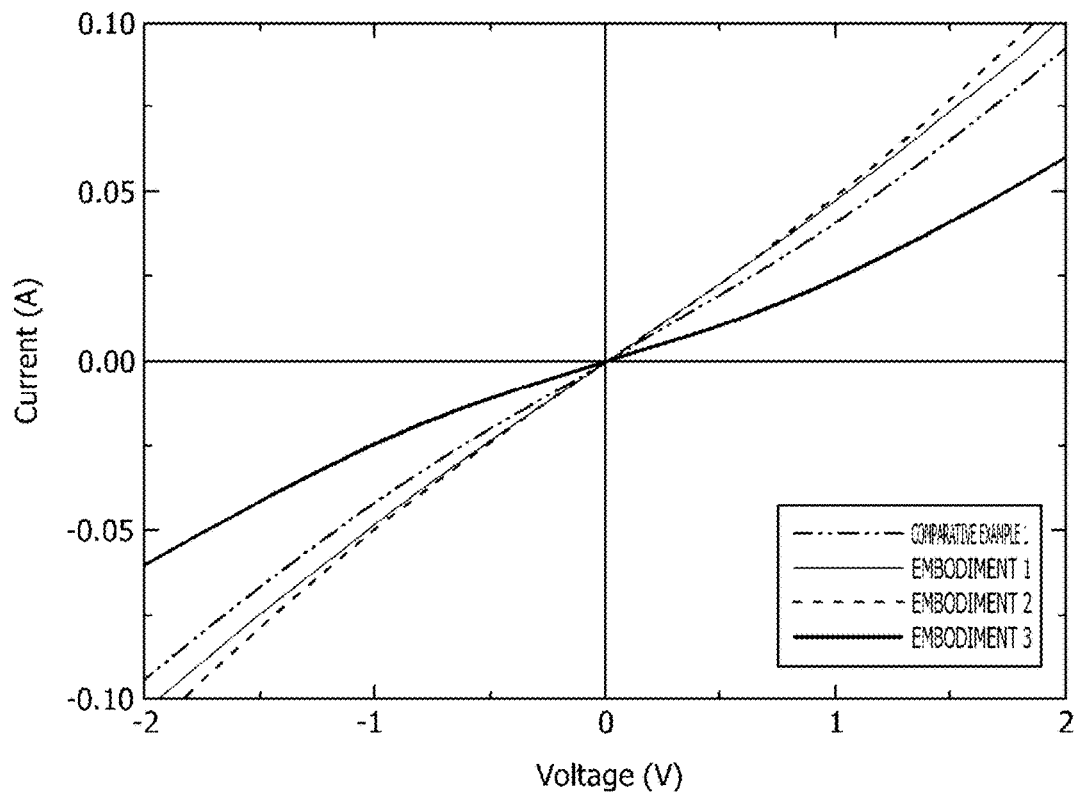
FIG. 10 is a graph showing voltage and current values of first electrodes of FIGS. 9A to 9D based on transmission line measurement (TLM).

FIGS. 9A to 9D show the ball-up phenomenon observed in different configurations of a first electrode in a semiconductor device according to an embodiment of the present invention. FIG. 9A shows an observation result of comparative example 1, FIG. 9B shows an observation result of Embodiment 1, FIG. 9C shows an observation result of Embodiment 2, and FIG. 9D shows an observation result of Embodiment 3. FIG. 10 is a graph showing voltage and current values of the first electrodes of FIGS. 9A to 9D based on TLM. In the graph of FIG. 10, a higher slope indicates a low resistance and may denote good ohmic characteristics. Comparative example 1, Embodiment 1, Embodiment 2, and Embodiment 3 are compared with each other below with reference to Table 2.

In the case of Comparative example 1, a first metal layer had a thickness of 130 nm, and accordingly, the ball-up phenomenon was observed notably more than in Embodiment 1 to Embodiment 3 (see FIG. 9A). Referring to Table 2, it is possible to see that the contact resistivity value of Comparative example 1 was relatively greater than those of Embodiments 2 and 3. Referring to FIG. 10, it is possible to see that the ohmic characteristics of Comparative example 1 were inferior to those of Embodiments 1 and 2 but were considerably better than those of Embodiment 3. However, the ball-up phenomenon was frequently observed in Comparative example 1, and as a result, Comparative example 1 is not appropriate for the first electrode.

In the case of Embodiment 1, the ball-up phenomenon was hardly observed, and thus it is possible to see that surface characteristics were very good (see FIG. 9B). Meanwhile, Embodiment 1 and Comparative example 1 had the largest contact resistivity. However, referring to FIG. 10, it is possible to see that ohmic characteristics of Embodiment 1 were good next to Embodiment 3. Consequently, the contact resistivity of Embodiment 1 was a little higher than those of Embodiments 2 and 3, but Embodiment 1 may be used as the first electrode because of good surface characteristics and ohmic characteristics.

In the case of Embodiment 2, the first metal layer (Al) was configured to be thicker than that of Embodiment 1. Since Al is a metal for controlling ohmic characteristics, it is possible to see that the contact resistivity of Embodiment 2 was remarkably lower than that of Embodiment 1 (see Table 2). Also, referring to FIG. 10, it is possible to see that the ohmic characteristics of Embodiment 2 were the best. However, since the first metal layer became thicker, the ball-up phenomenon may occur more frequently than in Embodiment 1 (see FIG. 9C). Consequently, although Embodiment 2 showed slightly worse surface characteristics than Embodiments 1 and 3, Embodiment 2 showed the best results in terms of contact resistivity and ohmic characteristics and may accordingly be used as the first electrode.

In the case of Embodiment 3, the second metal layer (Ni) was configured to be thicker than that of Embodiment 2. Since Ni serves as a barrier for preventing diffusion of metals, it is possible to see that the ball-up phenomenon was hardly observed in Embodiment 3 in comparison to Embodiment 2 (see FIG. 9D). However, since the second layer became thicker, it is possible to see that the contact resistivity was increased (see Table 2) and the ohmic characteristics were degraded in comparison to Embodiment 2 (see FIG. 10). Consequently, although Embodiment 3 showed slightly worse contact resistivity and ohmic characteristics than Embodiments 1 and 2, Embodiment 3 may be used as the first electrode due to good surface characteristics.

TLM Results According to Various Modifications of First Electrode

In Table 3, Rc, Rs, and $\sigma_c$ of various modified first electrodes are compared with each other through TLM. A first electrode may have a structure of a $1^{st}$-1 layer/a $1^{st}$-2 layer/a first metal layer (a $1^{st}$-3 layer)/a second layer/a third layer. The first electrode may be subjected to a thermal process. The first metal layer may include Al, and a second metal layer may include Ni. Also, the $1^{st}$-1 layer may include Cr, the $1^{st}$-2 layer may include Ti, and the third layer may include Au.

R1, R2, and R3 are first electrodes according to the embodiment of the present invention, T1, T2-1, T2-2, T3-1, T3-2, and T3-3 are modified first electrodes. Here, an intermediate layer indicates a layer interposed between the second layer and the third layer. Rc, Rs, and $\sigma_c$ indicate contact resistance, surface resistance, and contact resistivity, respectively. Ohmic characteristics are degraded with an increase in resistance.

TABLE 3

|  | Al (nm) | Ni (nm) | Intermediate layer structure | Rc | Rs | $\sigma_c$ |
|---|---|---|---|---|---|---|
| R1 | 120 | 50 | — | 11.38 | 52.79 | 2.21.E−03 |
| T1 | 300 | 100 | Cu/Ni | 1299.39 | −187.99 | −8.08.E+00 |
| R2 | 120 | 50 | — | 11.20 | 56.25 | 2.01.E−03 |
| T2-1 | 120 | 100 | Ti/Ni/Ti/Cu | 12102.89 | 2556.98 | 5.16.E+01 |
| T2-2 | 120 | 5 | Cu | 23.63 | 57.53 | 8.73.E−03 |
| R3 | 120 | 50 | — | 14.48 | 66.88 | 2.82.E−03 |
| T3-1 | 60 | 50 | — | 269.23 | 227.86 | 2.86.E−01 |
| T3-2 | 90 | 50 | — | 20.80 | 67.17 | 5.80.E−03 |
| T3-3 | 150 | 50 | — | 10.23 | 46.46 | 2.03.E−03 |

In the case of T1, the first metal layer (Al) was formed to have a thickness of 300 nm to improve ohmic characteristics, and the second layer (Ni) was formed to have a thickness of 100 nm to serve as a barrier. Also, an intermediate layer was additionally formed of Cu/Ni between the second layer and the third layer. Cu may serve as a barrier. In this case, however, a contact resistance value was considerably increased by excessive Al and Ni in comparison to R1. Therefore, it is possible to expect that ohmic characteristics will not be improved but rather, degraded. In particular, the surface resistance and the contact resistivity had negative values, and accordingly, it is possible to see that ohmic contact was not made in T1. Therefore, T1 is not appropriate for the first electrode.

In the case of T2-1, the first metal layer had the same thickness as R2. In T2-1, the second layer was formed to have a thickness of 100 nm, and an intermediate layer was additionally formed to observe whether the barrier effect was improved in comparison to R2. However, ohmic contact may not be made due to the excessive thickness of the second layer and the intermediate layer. In other words, the contact resistance, surface resistance, and contact resistivity of T2-1 were considerably greater than those of R2. Therefore, T2-1 is not appropriate for the first electrode.

In the case of T2-2, the second layer was reduced in thickness, and a Cu barrier layer was added to the intermediate layer. However, the contact resistance of T2-2 was increased as compared to that of R2, and the ohmic contact was degraded. Therefore, T2-2 is not appropriate for the first electrode.

In the cases of T3-1 and T3-2, the first metal layer was formed to have thicknesses of 60 nm and 90 nm, respectively. It is possible to see that all of the contact resistance, the surface resistance, and the contact resistivity of T3-1 were considerably increased as compared to those of R3. In other words, in T3-1, the thickness of the first metal layer was less than the thickness of the second layer such that ohmic contact may not be made. Also, it is possible to see that a contact resistance of T3-2 was increased as compared to that of R3. In other words, in T3-2, the thickness of the first metal layer was less than the thickness of the second layer but greater than the thickness of the first layer in T3-1. Therefore, ohmic characteristics may be degraded. Consequently, since the thicknesses of the first metal layer of T3-1 and T3-2 were less than the thickness of the second layer, T3-1 and T3-2 are not appropriate for the first electrode.

In the case of T3-3, the first metal layer was formed to have a thickness of 150 nm. In this case, it is possible to see that both the contact resistance and the surface resistance were reduced as compared to those of R3. However, referring to FIG. 9A, it is possible to expect that the ball-up phenomenon will occur frequently and many voids will be generated. In other words, both the contact resistance and the surface resistance of T3-3 were low, and accordingly, ohmic characteristics may be improved. However, T3-3 is not appropriate for the first electrode due to inferior surface characteristics.

Figure 11:
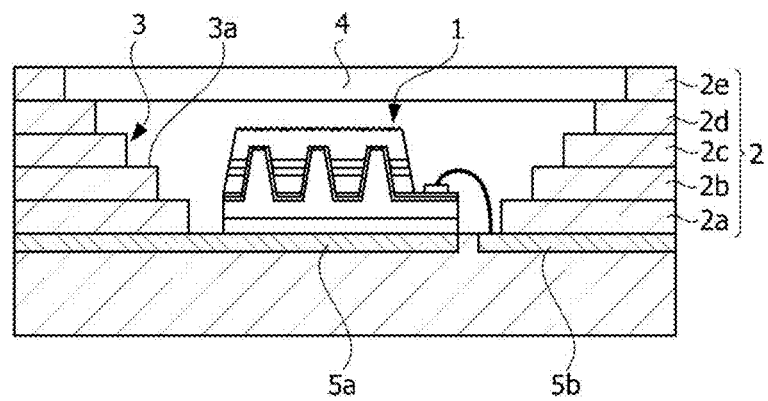
FIG. 11 is a conceptual view of a semiconductor package according to an embodiment of the present invention.

FIG. 11 is a conceptual view of a semiconductor package according to an embodiment of the present invention.

A semiconductor device may be configured as a package and used for curing a resin, a resist, a spin-on-dielectric (SOD), or a spin-on-glass (SOG). Alternatively, the semiconductor device may be used for medical treatment or health care or used for sterilization in an air purifier, a water purifier, or the like.

Referring to FIG. 11, the semiconductor device package may include a body 2 in which a groove 3 is formed, a semiconductor device 1 disposed in the body 2, and one pair of lead frames 5a and 5b which are disposed in the body and electrically coupled to the semiconductor device 1. The semiconductor device 1 may include all the elements described above.

The body 2 may include a material or a coating layer which reflects ultraviolet light. The body 2 may be formed by stacking a plurality of layers 2a, 2b, 2c, 2d, and 2e. The plurality of layers 2a, 2b, 2c, 2d, and 2e may be formed of the same material or may include different materials.

The groove 3 may be formed to become progressively wider away from the semiconductor device, and steps 3a may be formed in an inclined surface.

A transparent layer 4 may cover the groove 3. The transparent layer 4 may be formed of a glass material but is not necessarily limited thereto. The transparent layer 4 may be formed of any material which effectively transmits ultraviolet light. The inside of the groove 3 may be an empty space.

The semiconductor device may be used as a light source of an illumination system, a light source of an image display device, or a light source of an illumination device. In other words, the semiconductor device may be disposed in a case and applied to various electronic devices which provide light. For example, when the semiconductor device and a red-green-blue (RGB) fluorescent substance are used in combination, it is possible to implement white light with a high color rendering index (CRI).

The above-described semiconductor device may constitute a light-emitting device package and may be used as a light source of an illumination system. For example, the semiconductor device may be used as a light source of an image display device or a light source of an illumination device or the like.

When the semiconductor device is used as a backlight unit of an image display device, the semiconductor device may be used as an edge-type backlight unit or a direct-type backlight unit. When the semiconductor device is used as a light source of an illumination device, the semiconductor device may be used as a light fixture or a bulb-type light source. Also, the semiconductor device may be used as a light source of a mobile terminal.

The light-emitting device may be a laser diode in addition to the above described light-emitting diode.

Like the light-emitting diode, the laser diode may include a first conductive semiconductor layer and a second conductive semiconductor layer of the above-described structure. The laser diode uses an electro-luminescence phenomenon in which light is emitted when a current flows after the bonding of a p-type first conductive semiconductor and an n-type second conductive semiconductor, but the laser diode has differences in terms of the direction and phase of emitted light. In other words, the laser diode may emit light having one specific wavelength (monochromatic beam) in the same phase and same direction using a stimulated emission phenomenon, a reinforcing interference phenomenon, and the like. Due to such characteristics, the laser diode may be used for optical communication or medical equipment, semiconductor process equipment, and the like.

An example of a light-receiving device may be a photodetector, which is a transducer for detecting light and converting the intensity of the light into an electrical signal. The light-receiving device may be a photocell (silicon or selenium), a photoconductive device (cadmium sulfide or cadmium selenide), a photodiode (e.g., a photodiode (PD) having a peak wavelength in a visible blind spectral region or a true blind spectral region), a phototransistor, a photomultiplier, a phototube (vacuum or gas sealing), an infra-red (IR) detector, etc., but the embodiment is not limited thereto.

In general, a semiconductor device such as a photodetector may be fabricated using a direct bandgap semiconductor which has high photoconversion efficiency. Alternatively, there are various structures of photodetectors, of which the most general include pin-type photodetectors using a p-n junction, Schottky-type photodetectors using a Schottky junction, metal semiconductor metal (MSM)-type photodetectors, and the like.

Like a light-emitting device, a photodiode may include a first conductive semiconductor layer, an active layer, and a second conductive semiconductor layer of the above-described structure and configured in a p-n junction or pin structure. The photodiode is operated by applying a reverse bias or zero bias. When light is incident on the photodiode, electrons and holes are generated and a current flows. In this case, the current may be almost proportional to the intensity of light incident on the photodiode.

A photocell or a solar cell is a photodiode and may convert light into a current. Like a light-emitting device, a solar cell may include a first conductive semiconductor layer, an active layer, and a second conductive semiconductor layer of the above-described structure.

Also, the photodiode may be used as a rectifier of an electronic circuit through the rectifying characteristics of a general diode that uses a p-n junction and may be applied to a very high frequency circuit and then applied to an oscillation circuit or the like.

The above-described semiconductor device is not implemented with only a semiconductor and may further include a metal material in some cases. For example, a semiconductor device such as a light-receiving device may be implemented with at least one of Ag, Al, Au, In, Ga, N, Zn, Se, P, and As and may be implemented with a semiconductor material doped with a p-type or n-type dopant or an intrinsic semiconductor material.

Although embodiments are mainly described above, they are only examples and do not limit the present invention. Those of ordinary skill in the art may appreciate that several variations and applications not presented above can be made without departing from the essential characteristic of embodiments. For example, each element specifically represented in the embodiments may be implemented in a modified manner. It should be construed that differences related to such a variation and application are included in the scope of the present invention defined in the following claims.

The invention claimed is:

1. A semiconductor device comprising:
a light-emitting structure including a first conductive semiconductor layer, a second conductive semiconductor layer, and an active layer disposed between the first conductive semiconductor layer and the second conductive semiconductor layer;
first electrodes electrically coupled to the first conductive semiconductor layer; and
a second electrode electrically coupled to the second conductive semiconductor layer,
wherein the first electrodes include a first layer, a second layer, and a third layer,
the first layer includes a first metal layer including a first metal, and
a diffusion coefficient of the first metal is greater than a diffusion coefficient of a third metal included in the third layer,
wherein the first layer is contact with the first conductive semiconductor layer,
wherein the second layer is disposed between the first metal layer and the third layer, and
wherein a thickness of the second layer is in a range of 0.4 to 0.53 times a thickness of the first metal layer.

2. The semiconductor device of claim 1, wherein the first layer further includes:
a $1^{st}$-1 layer; and
a $1^{st}$-2 layer disposed between the $1^{st}$-1 layer and the first metal layer, and
wherein a thickness of the first metal layer is in a range of 1.5 to 2.5 times the sum of thicknesses of the $1^{st}$-1 layer and the $1^{st}$-2 layer.

3. The semiconductor device of claim 2, wherein the $1^{st}$-1 layer includes Cr, and
wherein the $1^{st}$-2 layer includes Ti.

4. The semiconductor device of claim 1, further comprising a reflective layer disposed on the second electrode; and
a capping layer disposed on the reflective layer and including a plurality of layers.

5. The semiconductor device of claim 1, wherein the light-emitting structure further includes a plurality of recesses passing through the second conductive semiconductor layer and the active layer and extending to a partial region of the first conductive semiconductor layer, and
the first electrodes are disposed in the plurality of recesses.

6. The semiconductor device of claim 5, wherein the first metal is Al, and
a ratio of an Al ratio of the first region to an Al ratio of the second region is in a range of 1:1.5 to 1:2.5.

7. The semiconductor device of claim 1, wherein the first layer includes a first region and a second region,
a ratio of the first metal included in the second region is greater than a ratio of the first metal included in the first region, and
a thickness ratio of the first region to the second region is in a range of 3:7 to 6.3:3.5.

* * * * *